United States Patent
Kumaran et al.

(10) Patent No.: US 9,941,899 B1
(45) Date of Patent: Apr. 10, 2018

(54) ELASTIC DATA PACKER

(71) Applicant: Innovium, Inc., San Jose, CA (US)

(72) Inventors: Mani Kumaran, San Jose, CA (US); Rupa Budhia, San Jose, CA (US); Meg Lin, Saratoga, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 15/681,249

(22) Filed: Aug. 18, 2017

Related U.S. Application Data

(63) Continuation of application No. 15/468,091, filed on Mar. 23, 2017, now Pat. No. 9,742,436, which is a continuation of application No. 15/269,076, filed on Sep. 19, 2016, now Pat. No. 9,654,137, which is a continuation of application No. 14/843,524, filed on Sep. 2, 2015, now Pat. No. 9,450,604.

(51) Int. Cl.
*H03M 7/30* (2006.01)
*H04B 7/26* (2006.01)

(52) U.S. Cl.
CPC ............ *H03M 7/3082* (2013.01); *H03M 7/30* (2013.01); *H04B 7/2606* (2013.01); *H05K 999/99* (2013.01)

(58) Field of Classification Search
CPC ...... H03M 7/30; H05K 999/99; H04B 7/2606
USPC .......................... 341/87, 50; 714/32; 370/315
See application file for complete search history.

(56) References Cited

U.S. PATENT DOCUMENTS

| | | |
|---|---|---|
| 9,450,604 B1 | 9/2016 | Kumaran et al. |
| 9,654,137 B1 | 5/2017 | Kumaran et al. |
| 9,742,436 B1 | 8/2017 | Kumaran et al. |
| 2014/0101485 A1 * | 4/2014 | Wegener ............. H03M 7/3068 714/32 |

OTHER PUBLICATIONS

U.S. Appl. No. 14/843,524, Notice of Allowance dated Feb. 1, 2016.
U.S. Appl. No. 14/843,524, Notice of Allowance dated May 12, 2016.
U.S. Appl. No. 15/269,076, Notice of Allowance dated Jan. 12, 2017.
U.S. Appl. No. 15/468,091, Non-Final Office Action dated Apr. 18, 2017.
U.S. Appl. No. 15/468,091, Notice of Allowance dated May 24, 2017.

* cited by examiner

*Primary Examiner* — Joseph Lauture
(74) *Attorney, Agent, or Firm* — Wong & Rees LLP; Karl T. Rees

(57) ABSTRACT

This disclosure relates to compressing and/or decompressing a group of similar data units, such as a table or queue of data units processed by a networking device or other computing apparatus. Each data unit in the group may only have values for fields in a master set. The described systems are particularly suited for hardware-level processing of groups of sparsely-populated data units, in which a large number of the data units have values for only a small number of the fields. In an embodiment, non-value carrying fields in a data unit are compressed based on a compression profile selected for the data unit. The compression profile indicates, for each master field, whether the compressed data unit includes a value for that field. Non-value carrying fields are omitted from the compressed data unit. The compression profile also permits compression of value-carrying fields using variable-width field lengths specified in the profile.

20 Claims, 13 Drawing Sheets

ELASTIC DATA PACKER

PRIORITY CLAIM

This application claims benefit under 35 U.S.C. § 120 as a Continuation of application Ser. No. 15/468,091, filed Mar. 23, 2017, which is a Continuation of application Ser. No. 15/269,076, filed Sep. 19, 2016, which is a Continuation of application Ser. No. 14/843,524, filed Sep. 2, 2015, the entire contents of each which is hereby incorporated by reference as if fully set forth herein. Applicant hereby rescinds any disclaimer of claim scope in the parent application(s) or the prosecution history thereof and advise the USPTO that the claims in this application may be broader than any claim in the parent application(s).

CROSS-REFERENCE TO RELATED APPLICATIONS

This application is related to U.S. patent application Ser. No. 14/843,513, filed on Sep. 2, 2015, entitled "Elastic Data Unpacker," by Kumaran et al., the entire contents of which are hereby incorporated by reference for all purposes as if fully set forth herein.

TECHNICAL FIELD

Embodiments relate generally to hardware-level handling of compressed data units.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Memory constraints are a performance bottleneck for many computing apparatuses, such as network routers, switches, and other infrastructure devices. For example, a router may need to cache or store large tables of packet headers, policies, attributes, instructions, or other information. Adding additional memory and/or including higher-speed memory in such apparatuses may increase their performance. However, there are a number of practical limitations to how much memory, higher-speed or otherwise, may be included in a computing apparatus.

In some cases, an alternative to increasing the amount of memory may be to store data in a compressed format within the available memory. For example, a general-purpose processor within the apparatus may be configured to compress the data before storing the data in memory by executing software-based instructions for any of a number of conventional compression algorithms. The general-purpose processor may then decompress the stored data as needed by executing software-based instructions for counterpart decompression algorithm(s). However, utilizing a general-purpose processor to execute a conventional software decompression algorithm prior to processing the data may be costly from a performance-perspective, overly complex, and/or not optimal for certain types of usage patterns.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
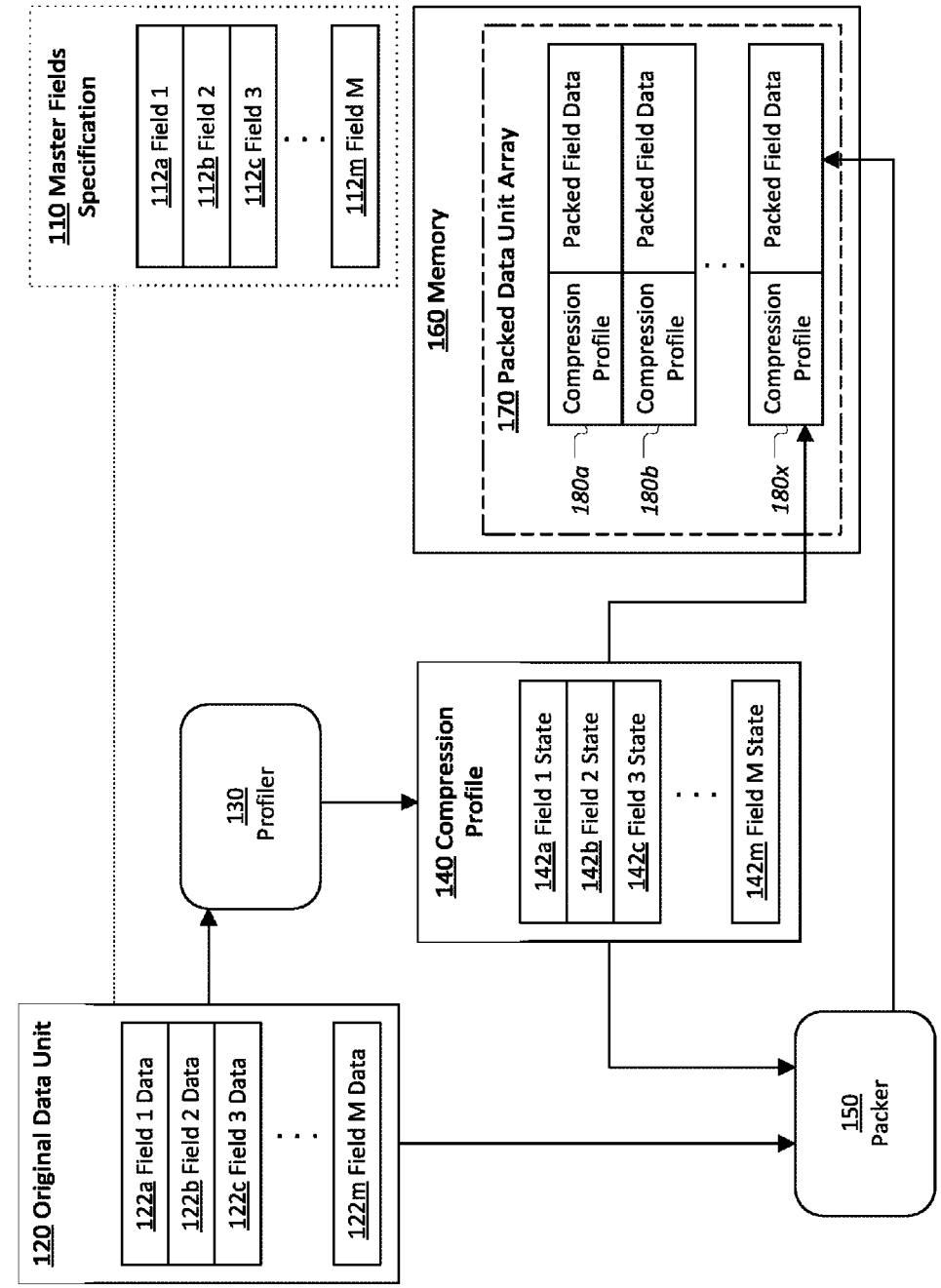
FIG. 1 is an illustrative view of various aspects of an example subsystem for compressing data.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. General Overview
2.0. Data Compression
2.1. Data Units
2.2. Profiles
2.3. Packed Data Unit
2.4. Advanced Profiling
2.5. Example Compression Process Flows
2.6. Example Packed Data Units
3.0. Data Decompression
3.1. Data Unpacker
3.2. Field Parser
3.3. Value Convertor
3.4. Profile Selector
3.5. Example Process Flows
4.0. Implementation Examples and Optimizations
4.1. Example Use Cases
4.2. Advanced Compression Schemes
4.3. Data Packer Example
4.4. Modular Data Packer
4.5. Example Data Unpacker
4.6. Partially-Packed Data Units
4.7. Pipelined Unpacker
4.8. Nested Unpackers 4.9. Parallel Unpackers
4.10. Multiple Data Unpackers
4.11. Genericized Data Units
5.0. Example Embodiments
6.0. Implementation Mechanism—Hardware Overview
7.0. Extensions and Alternatives

1.0. GENERAL OVERVIEW

Approaches, techniques, and mechanisms are disclosed for compressing and/or decompressing data structures referred to herein as "data units." A data unit comprises data for any of a number of fields. Each field corresponds to a different location within a data unit. Each field's data has a specified purpose. In an embodiment, each field—at least in uncompressed form—further has a fixed length, such as a specific number of bits used to represent the data belonging to that field. In many cases, computing components that processes the data units are designed around assumptions that the data in these fields will always be of the respective fixed field lengths.

The approaches, techniques, and mechanisms described herein are relevant to groups, or "arrays," of similar data units. Each data unit in the array may only have values for fields in a "master" set of fields. The described systems are particularly suited for processing arrays of sparsely-populated data units, in which a large number of the data units have values for only a small number of the fields, and those fields may vary from unit to unit. For instance, an array may be used to store data units representative of rules for routing network traffic. For any given rule, there may be a number of fields for a large number of policies, attributes, actions, and so forth. However, for many rules, there may only be one or two relevant policies, and thus many of the data units may only carry values in a handful of the defined fields. Conventionally, at the hardware level, if a data unit does not carry a value for a field, the data unit is nonetheless required to store an empty or "null" value for that field, having the same fixed length as any other value for that field would. For instance, if a non-value carrying field has a fixed field length of 32 bits, the data unit may be required to store 32 zeros in the field, or some other arbitrary 32 bit value designated as representing "null."

According to an embodiment, memory may be saved when storing a data unit by compressing non-value carrying fields based on a compression profile selected for the data unit. The compression profile indicates, for each field in the master set, whether the compressed data unit includes a value for that field. Non-value carrying fields may thus be omitted from the compressed data unit. The compressed data unit is also referred to herein as a packed data unit.

In an embodiment, the compression profile also permits compression of value-carrying fields using variable-width field lengths specified in the profile. Values that do not need to be represented using the full fixed length of bits assigned to a field must typically be "padded" with extra zeros or other insignificant "filler" data so as to be of the full fixed length. This padding may be removed for compression, and the compression profile may specify the packed length of each field.

Because the data units in an array, though similar with respect to the master set of fields, may nonetheless vary greatly with respect to which fields actually carry values, different profiles may be used for different data units in the array. For arrays where data units commonly conform to a same subset of profiles, a table of the profiles may be stored. Each packed data unit may include a "compression profile index" that references its associated profile. In an embodiment, the selection of a profile to associate with a data unit may be optimized to balance minimizing the size of the packed data unit and limiting the number of profiles stored in the table.

According to an embodiment, a compression subsystem is implemented at a hardware level for "packing" uncompressed vectors, which are essentially data units such as described above. The compression subsystem may be implemented, for instance, as one or more Field Programmable Gate Arrays ("FPGA"), Application Specific Integrated Circuits ("ASIC"), or other specialized circuitry within a computing device. The compression subsystem includes a profiler component that generates and/or otherwise identifies an appropriate profile for the uncompressed data unit. The compression subsystem further includes a data packer that inputs the identified profile and the uncompressed data unit, and generates a packed data unit based thereon, in which field data is compressed in the manner described above. The packed data unit may be stored or forwarded to another component for further processing.

According to an embodiment, a decompression subsystem is implemented at a hardware level for "unpacking" data units in arrays that have been packed in the above manner. The decompression subsystem may be implemented, for instance, as one or more Field Programmable Gate Arrays ("FPGA"), Application Specific Integrated Circuits ("ASIC"), or other specialized circuitry within a computing device. The decompression subsystem includes a profile selector component that identifies and interprets a profile associated with each packed data unit. The profile may be stored directly in association with the packed data unit, or in an entry within an indexed table that is referenced by the packed data unit.

The profile information is provided with the packed data unit to an "unpacker" component. The unpacker component iteratively processes each field in the master set, in an order indicated by the profile. The unpacker includes field outputs for each field in the master set, which may be routed to appropriate subsystems of the computing device in accordance with their manner of usage. If the profile information indicates that a field is not present, the unpacker outputs a null value, or no value, to the corresponding field output. Otherwise, the unpacker parses a number of bits corresponding to the length of the packed field from the front, back, or other identified location within the packed data unit, and sends the parsed value to the corresponding field output. The process then repeats for the next field in the master set.

According to an embodiment, an apparatus may include both one or more compression subsystems for compressing and storing the original data units in packed form, and one or more decompression subsystems for decompressing packed data units and outputting field data in uncompressed form, in accordance with the described techniques. However, in other embodiments, an apparatus need not necessarily comprise both a compression subsystem and a decompression subsystem. For instance, some devices may only be configured to compress data, while others may only be configured to decompress data. Moreover, in some embodiments, the described decompression subsystems may be used to decompress conforming data units compressed through any suitable mechanism, and not just those described herein. Likewise, the data units produced by the described compression subsystems need not necessarily, in some embodiments, be decompressed using the decompression mechanisms described herein.

2.0. DATA COMPRESSION

FIG. 1 is an illustrative view of various aspects of an example subsystem 100 for compressing data, according to an embodiment. Subsystem 100 is configured to compress data units in an array of data units.

2.1. Data Units

Each data unit comprises data for any of a number of fields, which are defined by master field specification 110. These fields are depicted as fields 112a through 112m, and referred to collectively as fields 112.

Each field 112 corresponds to a different location within each data unit. The data stored within the location to which a field 112 corresponds is defined to have a specific purpose associated with the field 112. For instance, if the data units processed by subsystem 100 were Internet Protocol (IP) headers, the master field specification 110 would include separate fields 112 for a source IP address, a destination IP address, protocol, and so forth. The techniques described herein are agnostic as to the specific purpose of any given field 112, but are rather concerned only with the fact that there is in fact a defined set of fields 112 for which each data unit may have data. The data units processed by subsystem 100 may only store data for some or all of fields 112.

A master field specification 110 need not actually be stored or included in subsystem 100, but is shown merely for illustrative purposes. In an embodiment, the master field specification 110 may be provided as input at runtime, thus allowing the subsystem 100 to be adapted for different types of data units 120. In another embodiment, the master field specification 110 is hard-coded into system 100.

For illustrative purposes, subsystem 100 is depicted as processing an original, uncompressed data unit 120. For each field 112, data unit 120 comprises field data 122, depicted as individual subunits of field data 122a through 122m that correspond to individual fields 112a through 112m. More generally, an uncompressed data unit 120 may simply be considered a vector of bits, the bits being a concatenation of field data 122a through 122m. Certain subunits of field data 122 may be value-carrying, in that the subunit of field data 122 is considered to represent a value that the data unit 120 assigns to the corresponding field 112. Other subunits of field data 122 may be non-value-carrying, in that the data is considered to be invalid or insignificant for the associated fields 112. A non-value carrying subunit of field data 122 may be indicated by a value designated to be empty, invalid, or "null." A specific value may be designated as null, or any value in which a designated bit (e.g. a "validity" bit) is set (or not set) may be considered to be invalid. Or, non-value-carrying field data 122 may be indicated by associated metadata.

Though not depicted, in an embodiment, each data unit 120 may be associated with descriptive metadata. This metadata may indicate, for instance, which of fields 112 are valid (value-carrying) within the data unit 120. This metadata may also or instead indicate, for each field 112, the width of data (e.g. number of bits) found in the data unit 120 for that field 112. This metadata may also or instead indicate which bits in a given subunit of field data 122 carry valid or useful data. The metadata may be carried inside the data unit itself (e.g. in the upper or lower bits), or simply be carried by separate data that is processed in parallel with the data unit 120.

Although subsystem 100 may be agnostic as to the manner in which such metadata came into existence, the metadata may have, for example, been generated with the data unit 120, at a time when the data unit 120 was placed in a queue for processing by subsystem 100, or any time thereafter. The metadata may be generated based on a context in which the data unit 120 was generated or received, type data associated with data unit 120, an analysis of the field data 122 within the data unit 120, and so forth.

2.2. Profiles

Data unit 120, or metadata describing data unit 120, is accessed from a memory or some other source by profiler 130. Profiler 130 may, for example, be implemented by one or more Field Programmable Gate Arrays ("FPGA"), Application Specific Integrated Circuits ("ASIC"), or other specialized circuitry within a computing device, or as software executed by a general purpose processor. Profiler 130 generates or identifies a compression profile 140 to associate with data unit 120. Compression profile 140, which may also be referred to as a packing profile, includes field state data 142 for at least each value-carrying field 112. Each individual subunit of field state data 142 indicates, for a corresponding field 112, information about what the state of the field 112 should be when compressed by the subsystem. For instance, field state data 142a may reflect the state of field 112a within a packed data unit 180 for data unit 120.

A given subunit of field state data 142 may indicate, for instance, whether or not a corresponding field 112 will be present within the packed data unit 180. In some embodiments, a positive or negative indication is specified for each possible field 112. In other embodiments, the omission of state data 142 for a field 112 implies that the field 112 will not be present within the packed data unit 180.

In an embodiment, the state data 142 may further specify a length of the field in the packed data unit 180, also referred to as a "packed length." This length is typically equal to or slightly more than the minimum number of bits required to represent the value of the field (e.g. the number of bits left after removing any leading zeros). In some embodiments, the profile 140 may indicate that data is present for a field 112 simply by specifying a non-zero packed length. In other embodiments, a separate bit may be used to indicate the presence of data for a field 112, as value-carrying data for certain types of fields 112 may theoretically be packed to a zero length, or such a bit may be desirable for optimization reasons. In other embodiments, the data lengths of some or all of the fields 112 may remain the same when packed, and thus need not be specified by the profile.

Profile 140 generally functions to indicate location information for locating the data for each field 112 that is to be present within the packed data unit 180. Profile 140 may thus be considered to include some form of extraction location information that indicates what data to extract from data unit 120 and place in the packed data unit 180. A number of examples of extraction location information that may be suitable in different embodiments are given throughout this disclosure, including field state data 142, instruction sets, container-based extraction location information, and so forth.

In embodiments illustrated by the example depicted in FIG. 1, the field state data 142 of the profile 140 is required to be arranged in the same order as the packed field data within packed data unit 180, so as to simplify the process of locating the data once packed inside packed data unit 180. This order may or may not be the same order as the order in which the field data 122 of the original data unit 120 was arranged. For instance, in the depicted example, the location information is indicated by a combination of the field ordering, information in the state data 142 indicating whether a field is present, and either the length information specified in the state data 142 for a field, or the fixed length information for the field, depending on the embodiment. The ordering requirement need not be universal across embodiments, though. A profile may indicate location information in a variety of other manners, including manners which allow for discernment of the location of the field data without strictly requiring that the field state data 142 be arranged within the profile 140 in the same order as the corresponding packed field data in packed data unit 180. For example, the field state data 142 that indicates the presence of a field 112 within the packed data unit 180 may also specify a sequence number for the field 112 within the packed data unit 180.

In an embodiment, field state data 142 takes the form of a group of instruction sets to extract bits from the data unit 120 for packing into the packed data unit 180. Each instruction set corresponds to a different field 112. For a data unit 120 containing M fields, there are thus M sets of the above information stored in the profile 140. An instruction set includes a field start offset, which is the offset into the vector where a field begins (e.g. expressed as a number of bits). The instruction set further includes a field extraction offset, which is an offset into the field to extract bits. The instruction set further includes a field extraction length, which is the length of bits to extract, starting at the field extraction offset. A length of zero means no bits are extracted for the field. The instruction set further includes a target offset, which is a target offset (i.e. location) into the packed data unit where the extracted bits are to be written.

In another embodiment, it is also possible to condense the information stored in the profile by having instruction sets only for the fields 112 or field segments that will be extracted. For a vector containing M fields, if bits from only Q fields need to be extracted, then there are Q sets of the above information stored in the profile 140. Each instruction set need include only an extraction offset, extraction length (starting at the extraction offset), and target offset. In yet other embodiments, the target offset may be implied from field ordering information combined with field or extraction length information. For instance, the target offset may be inferred from the running sum of each field's extraction length. In embodiments, an instruction set may specify bits to ignore rather than bits to extract, though such data is still considered to indicate an extraction offset and extraction length for the purposes of this disclosure.

In some embodiments, the field state data 142 may include other information. For instance, the field state data 142 may indicate how the value(s) for a certain field(s) 112 should be unpacked or decompressed, in embodiments where multiple compression/decompression mechanisms are available. For example, the field state data 142 may indicate that a given field should be compressed and/or decompressed using a specific lossless compression algorithm. Non-limiting examples of specific types of advanced compression schemes that may be specified by a profile 140 are given in other sections.

2.3. Packed Data Unit

Subsystem 100 further comprises a data packer 150. Like profiler 130, data packer 150 may, for example, be implemented by one or more Field Programmable Gate Arrays ("FPGA"), Application Specific Integrated Circuits ("ASIC"), or other specialized circuitry within a computing device, or as software executed by a general purpose processor. While depicted as separate logical components for illustrative purposes, in some embodiments profiler 130 and packer 150 are a single, integrated component.

Data packer 150 accepts as inputs the data unit 120 and profile 140. Based on the state data 142, data packer 150 converts data unit 120 into packed data unit 180, and stores the packed data unit 180 in an appropriate packed data unit array 170, or passes the packed data unit 180 on to a next processing component. The appropriate data unit array 170 or next processing unit may be fixed, a function of the identified profile, a function of a specific field 112, a function of associated descriptive metadata, and so forth.

A packed data unit array 170 comprises multiple packed data units 180, depicted as 180*a* through 180*x*. Each packed data unit includes a compression profile 140 and packed field data. The packed data unit array 170 may be stored in any suitable memory 160, such as a Random Access Memory (RAM), registers, and so forth. An array 170 may buffer or queue packed data units 180 for subsequent processing, or store packed data units 180 for an indefinite period of time, such as for device configuration or data storage.

In general, the packed field data generated by data packer 150 removes field data 122 for any non-value-carrying field in data unit 120, and optionally condenses the field data 122 for any value-carrying field to the length specified by the profile 140.

The foregoing may be accomplished using a variety of specific implementations, depending on the embodiment. For instance, generating the packed data unit may involve initializing a number of bits, equal in size to the width expected of the packed data unit 180, to a predefined value. The expected size of the packed data unit 180 is the sum of all the extraction lengths in a profile. The initialized bits may all be initialized to zero, for instance. Based on the field state data 142 (e.g. instruction sets), data packer 150 may perform a group of bitwise operations on the initialized packed data unit, with respect to the inputted uncompressed data unit 120, to generate the final packed data unit 180. Data packer may perform such operations entirely in a series, or break the data unit 180 into parallel components against which such operations are performed in parallel. Although a variety of implementations are possible, specific examples are given in other sections of this disclosure.

In some embodiments data packer 150 may be configured to perform additional steps such as rearranging the field data 122 to match an order indicated by the profile 140, or compressing a value using a more sophisticated algorithm indicated by the profile. While the additional overhead of compressing and decompressing the value using a more sophisticated algorithm may be undesirable in certain embodiments, there are nonetheless other embodiments where the overhead may be acceptable. Any suitable lossless compression algorithm may be used.

2.4. Advanced Profiling

Figure 2:
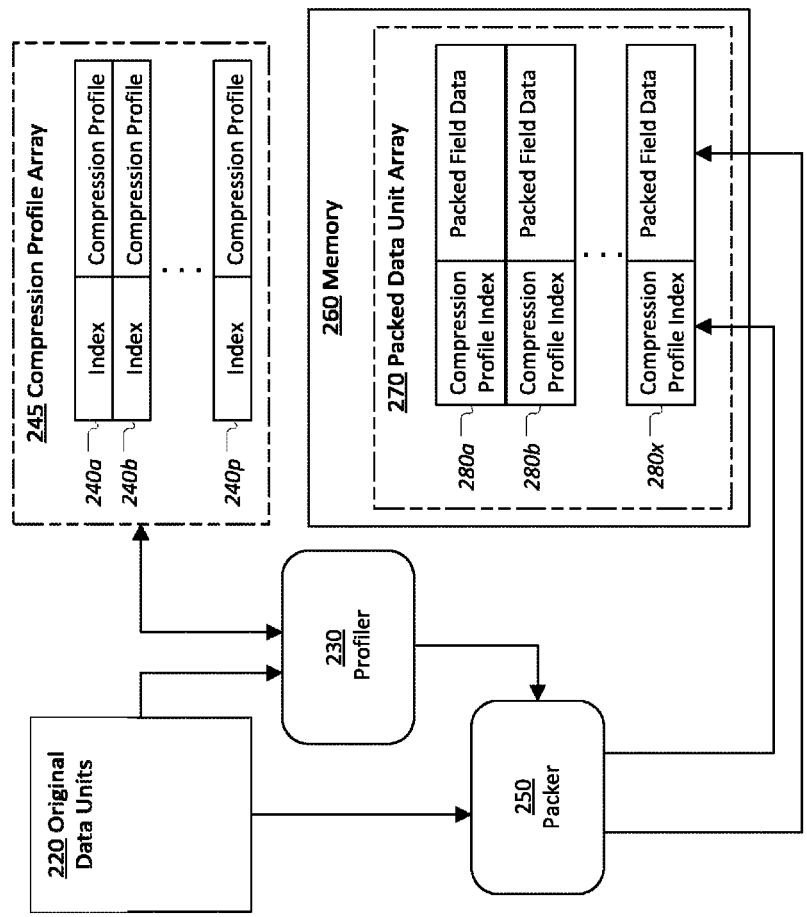
FIG. 2 illustrates a modified subsystem for compressing data units, in which compression profiles may be re-used for multiple packed data units.

FIG. 2 illustrates a modified subsystem 200 for compressing data units, in which compression profiles may be re-used for multiple packed data units, according to an embodiment. FIG. 2 comprises many components similar to those found in FIG. 1. For instance, FIG. 2 includes data units 220, profiler 230, data packer 250, memory 260, and packed data unit array 270, which are analogous to data unit 120, profiler 130, packer 150, memory 160, and packed data unit array 170, respectively.

However, subsystem 200 further stores a compression profile array 245, which may be stored in any suitable memory, including memory 260. Compression profile array 245 comprises a plurality of indexed profiles 240*a* through

240p, collectively referred to as compression profiles 240. Compression profiles 240 are analogous to profiles 140 in FIG. 1, except that they are also each associated with an index number by which they may be respectively referenced.

Packed data unit array 270 stores packed data units 280a through 280x, collectively referred to as packed data units 280. Packed data units 280 are analogous to packed data units 180, except that instead of including a compression profile 140, the packed data units 280 include an index number that refers back to an associated profile 240 in the compression profile array 245.

In an embodiment, profiler 230 is configured to generate profiles 240 in the same manner as profiler 130. When a generated profile 240 is not already in the array 245, profiler 130 adds the profile 240 to the array 245. Profiler 130 provides the index associated with the profile 240 to the data packer 250.

In an embodiment, before generating a new profile 240 for a data unit 220, profiler 230 may instead be configured to determine whether a suitable profile 240 already exists for the data unit 220. The suitable profile 240 need not be an optimal profile for compressing the data unit 220, but rather may be chosen so long as it compresses the data unit 220 at an acceptable level. For instance, in an embodiment, the profiler 130 may calculate or predict the optimal compressed length of the packed data 280 for the data unit 220. If a profile 240 would produce a packed data unit 280 whose length is within a certain threshold of that optimal length, the profile 240 may be used.

In such embodiments, the heuristic used to determine when to match an existing profile 240 to a data unit 220 as opposed to when to generate a new profile 240 may be fine-tuned to balance between objectives such as reducing the size of the array 245, reducing the complexity of the profiler 230, and/or reducing the sizes of the packed data units 280. Moreover, the heuristic used to generate a new profile 240 for a data unit 220 may likewise be optimized for these objectives, rather than always producing a packed data unit of optimal size.

For instance, a certain field may have values that may be represented using anywhere from 1 to 255 bits. If left to create profiles indiscriminately, the profiler 130 might create 256 different profiles. The number of profiles would rise exponentially for each such field in the master set. Instead, the profiler may be configured to only create profiles having lengths that are multiples of 4, 16, or some other suitable number, thus reducing the complexity of the compression profile array to a manageable size.

In another embodiment, a predefined set of profiles 240 may always be used, and profiler 130 may never actually create a new profile 240. In yet another embodiment, profiles may be constrained to certain combinations of fields using various predefined combination rules or logic. For instance, there may be a Profile P that includes Fields A, B, C, and D. A data unit may only have values for Fields A, B, and D. However, due to constraints on field combinations, Profile P would be used to compress the data unit rather than creating a new profile for the combination of A, B, and D. Hence, the packed data unit would include an empty field C.

In an embodiment, profiler 130 includes a profile selector that selects an applicable profile from a set of predefined profiles. The profile selector may be, for instance, implemented as a Ternary Content Addressable Memory (TCAM) or other matching algorithm on descriptive metadata associated with the data unit 120. In an embodiment, rather than outputting a profile itself, the profile selector outputs a tag that is stored in association with, or propagated with, the packed data unit 180. For instance, the tag can be a pointer to a stored profile in a profile table. Or, the tag can be a type indicator for the packed data unit. The tag may then be used by a subsequent data unpacker component to retrieve the appropriate profile. Throughout the disclosure, any reference to components inputting a profile should be understood as equally referring to components inputting such a tag and locating the referenced profile based thereon.

In an embodiment, the tuple {type, packed data unit} may be used as a match value in a subsequent TCAM lookup or exact match table lookup for determining how to further process or interpret the packed data unit. For instance, the type specified by a tag may indicate to a subsequent processing unit how to interpret the packed data unit. The subsequent processing unit can perform any of a number of different functions with respect to the packed data unit, such as classification, routing, further compression, and so forth.

2.5. Example Compression Process Flows

Figure 3:
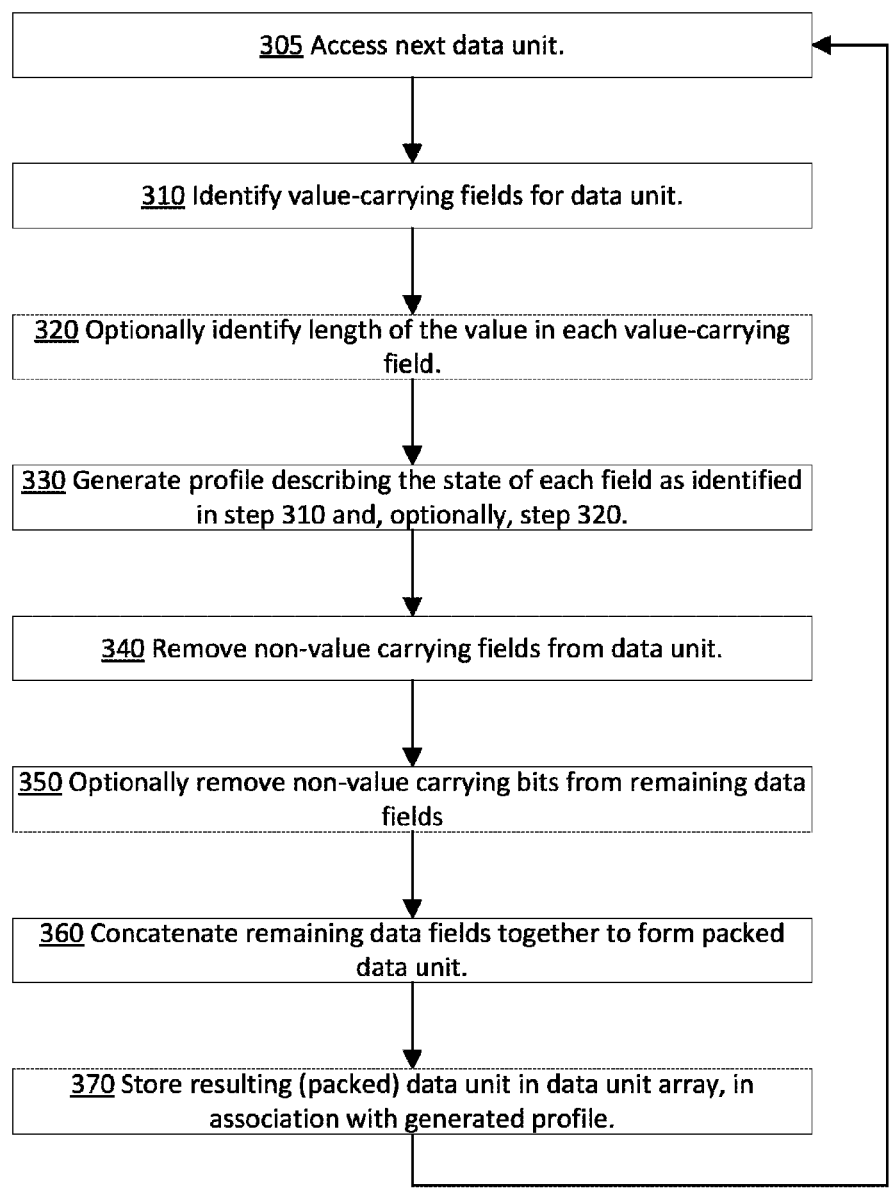
FIG. 3 illustrates an example flow for compressing data units.

FIG. 3 illustrates an example flow 300 for compressing data units, according to an embodiment. The various elements of flow 300 may be performed in a variety of systems, including systems such as systems 100 and 200 described above. In an embodiment, each of the processes described in connection with the functional blocks described below may be implemented using one or more computer programs, other software elements, and/or digital logic in any of a general-purpose computer or a special-purpose computer, while performing data retrieval, transformation, and storage operations that involve interacting with and transforming the physical state of memory of the computer.

Block 305 comprises accessing the first or next data unit in an array of data units. For instance, a profiler 230 may read an uncompressed data unit 220 from memory. Block 310 comprises identifying value-carrying fields for the data unit. Generally, a value-carrying field is any field for which data exists in the data unit, where that data represents some value other than a value that has been designated as invalid or "null." Block 320, which is optional depending on the embodiment, comprises identifying the length of the value in each value-carrying field. Note that the length of the value is not necessarily the length of the data in the field, as the data in the field may include extra "padding" that does not affect the value. For instance, the value 101 may be stored within the data unit as the value 00000101. Even though the length of the data is eight bits, the value itself only needs to be represented by three of those bits, and thus is considered to have a length of three bits.

Block 330 comprises generating a new profile, or selecting a pre-existing profile, that describes the state of each field to be compressed with respect to the information identified in blocks 320 and, optionally, 330. Hence, for instance, the state information for a given field may be a bit that indicates that the field carries a value and will thus be present within the packed data unit, and that the value for the field is of a length L. As explained above, to reduce the number of profiles, the length indicated by the profile for a field may not necessarily be the same length as identified in block 320, but rather may be any number greater than or equal to the length identified in block 320. Any suitable heuristic for selecting a length may be utilized.

Block 340 comprises, based on the determinations in block 320, and in accordance with the state information in the profile, removing some or all of the non-value carrying fields from the data unit. For instance, a data packer 250 may utilize a profile 240 assigned by a profiler 130 to determine a set of fields to output for use in block 360.

Block 350 is optional depending on whether block 330 is performed, and may be performed before or after block 340. Block 350 comprises removing non-value carrying bits from the remaining data fields, so as to limit each value to the length specified in the profile that was generated or selected in block 330. For instance, if the profile specifies a length of 4 bits, and the field data within the original data unit were 00000101, block 350 would comprise stripping the leading zeros from the field data and leaving the last four bits 0101. The non-value carrying bits may be specified or implicit from field state data, such as from instructions sets specifying extraction offsets and extraction lengths.

Block 360 comprises concatenating the data for each of the fields remaining after block 340, as potentially shortened in performance of block 350, together to form a packed data unit. The field data should be concatenated together in an order indicated by the profile. Block 370 comprises storing the packed data unit in an array of packed data units, such as a table of packed data units or a processing queue. The packed data unit is stored with the profile generated in block 330. Flow then returns to block 305 for processing the next available data unit.

Figure 4:
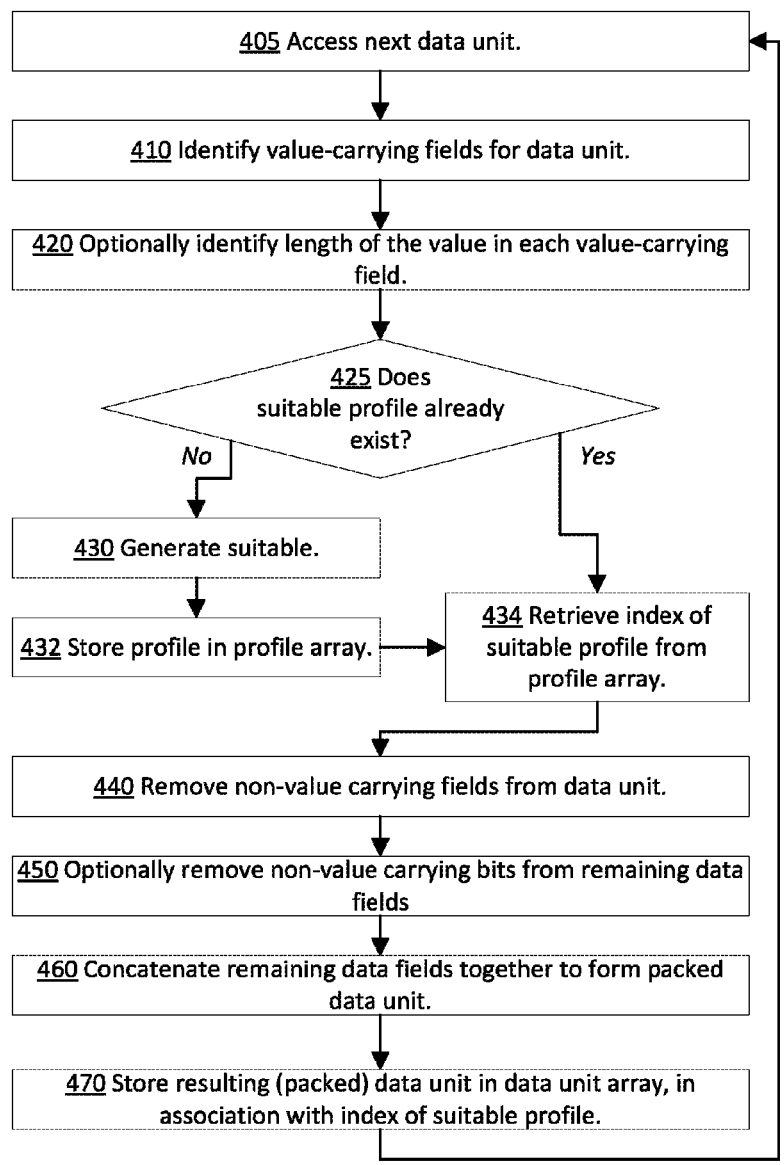
FIG. 4 illustrates an example process flow for compressing data units using indexed profiles.

FIG. 4 illustrates an example process flow 400 for compressing data units using indexed profiles, according to an embodiment. Blocks 405-420 correspond to blocks 305-320. Block 425 comprises determining whether a suitable profile already exists for the data unit. For instance, an array of profiles, such as profile array 345, may already exist. Block 425 may comprise comparing each profile to the information determined in block 410 and optionally block 420 to determine whether there is already a profile with the exact same information, and is thus deemed "suitable" for the current data unit.

Or block 425 may comprise first determining if there are any pre-existing profiles that indicate the presence of the exact same set of fields (or a superset thereof) found to carry values in block 410. Then, block 425 may comprise comparing the lengths defined for the value-carrying fields specified in each such pre-existing profile to the corresponding lengths identified in block 420. If, for one or more of the pre-existing profiles, the outcomes of those comparisons meets some threshold criterion or criteria, then the pre-existing profile that will produce the smallest packed data unit length for the unit may be determined as suitable.

For instance, a first criterion may be whether the respective lengths of each field, as specified in the profile, are greater than or equal to the corresponding data unit field lengths identified in block 420. A second criterion may be whether the differences between the profile-specified lengths and the identified lengths are individually or in aggregate no greater than a predefined threshold amount. Or, the second criterion may be whether, for each respective field, dividing the profile-specified length and the identified length by the same predefined divisor results in a same quotient. For instance, a divisor of 8 may be used to ensure that packed lengths for a given field fall at byte boundaries.

If a suitable profile is found, flow proceeds to block 434, described subsequently. If no suitable profile is found, then flow proceeds to block 430, which comprises generating a suitable profile as in block 330. Flow then proceeds to block 432, which comprises storing the profile in a profile array. Flow then proceeds to block 434, which comprises retrieving the index of the suitable or newly-generated profile from the profile array.

Blocks 440-460 proceed as in blocks 340-360. Block 470 is similar to block 370, except that the packed data unit is stored with the index of the suitable profile rather than with the profile directly.

Flows 300 and 400 are but examples of process flows that are suitable for compressing data units, according to embodiments. Other process flows may also or instead be utilized to compress data units, including flows with fewer or additional steps, in varying arrangements.

2.6. Example Packed Data Units

Figure 5:
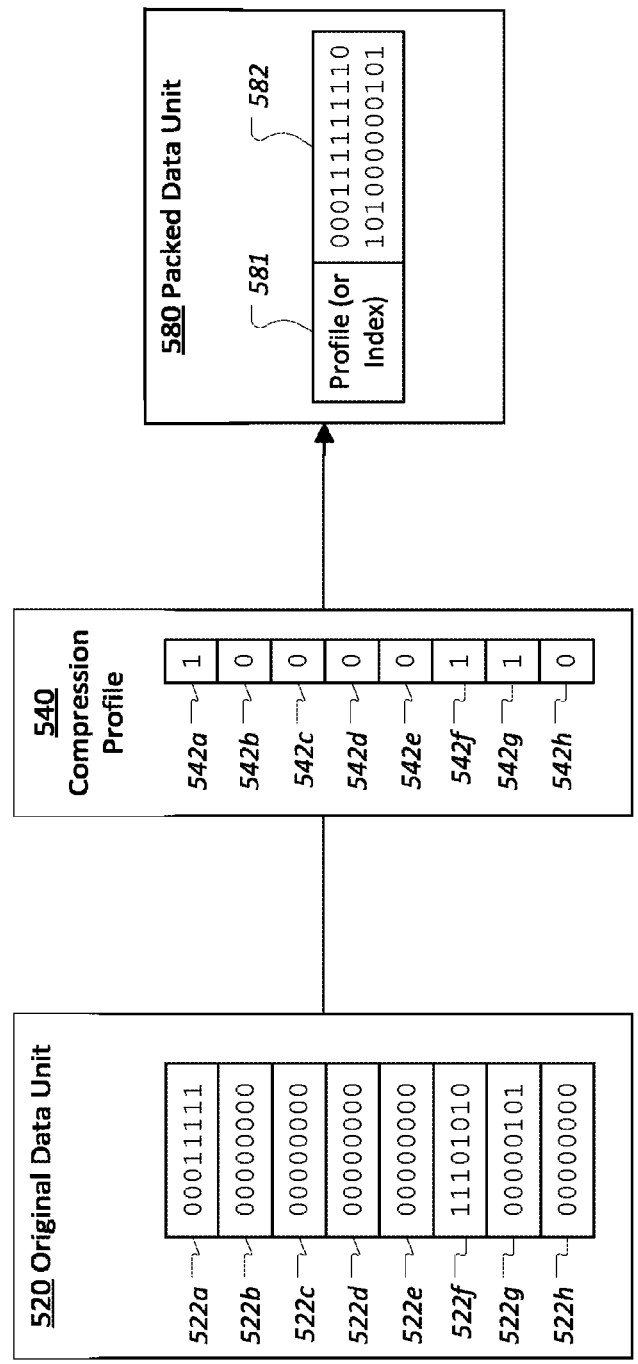
FIG. 5 is a block diagram illustrating an example packed data unit.

FIG. 5 is a block diagram 500 illustrating an example packed data unit 580, according to an embodiment. The original data unit 520 comprised field data 522a through 522h. Field data 522a, 522f, and 522g are, respectively, 00011111, 11101010, and 00000101. The remaining field data are each 00000000. In the depicted example, the field data 00000000 is considered to be empty or null. Thus, as depicted, field data 522b-522e are considered to be non-value carrying, as well as field data 522h. Of course, in other embodiments, other values such as 11111111 may be designated as empty or null, or any value starting with a 1 may be invalid, or the corresponding field data may simply be non-existent.

A compression profile 540 generated for data unit 520 comprises field state data 542a through 542h, represented as a single bit that indicates whether data for the corresponding field can be found in packed data unit 580. Field state data 542a, 542f, and 542g, corresponding to the value carrying field data 522a, 522f, and 522g, are assigned to 1, while the remaining field state data 542 are assigned to 0 to indicate that they are empty and thus not found in the packed data unit.

The resulting packed data unit 580 comprises a first segment 581 that comprises either a profile 540, or an index that references profile 540 in an array of profiles. The resulting packed data unit 581 also comprises a second segment 582, corresponding to the packed field data, which in this example is simply a concatenation of field data 522a, 522f, and 522g, or 000111111110101000000101.

Figure 6:
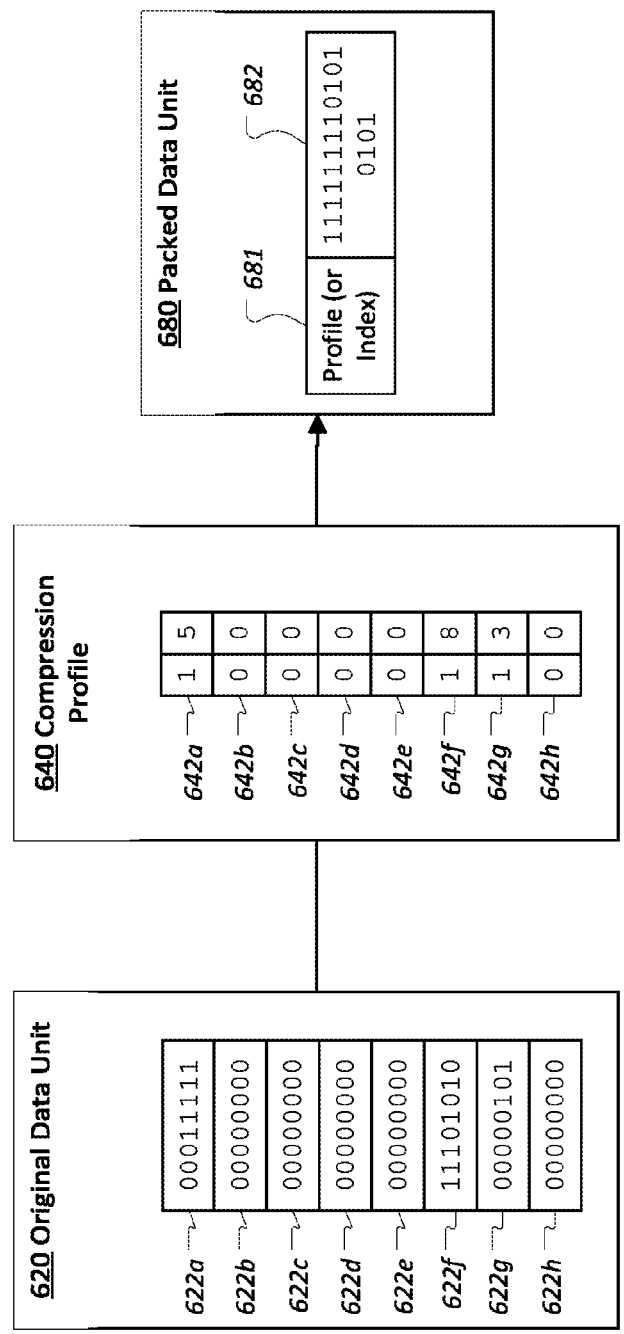
FIG. 6 is a block diagram illustrating an example packed data unit having variable length packed fields.

FIG. 6 is a block diagram 600 illustrating an example packed data unit 680 having variable length packed fields, according to an embodiment. The original data unit 620 is the same as the original data unit 520. The compression profile 640 likewise includes field state data 642. However, each field state data 642 includes not only the bit depicted with respect to field state data 542, but also a value length for the corresponding field data 622. For instance, field data 622a, which is 00011111, is deemed to have a value length of 5, which is in recorded field state data 642a. The resulting packed data unit 680 is similar to packed data unit 580, except that the second segment 682 is packed to 1111111101010101.

3.0. DATA DECOMPRESSION

Figure 7:
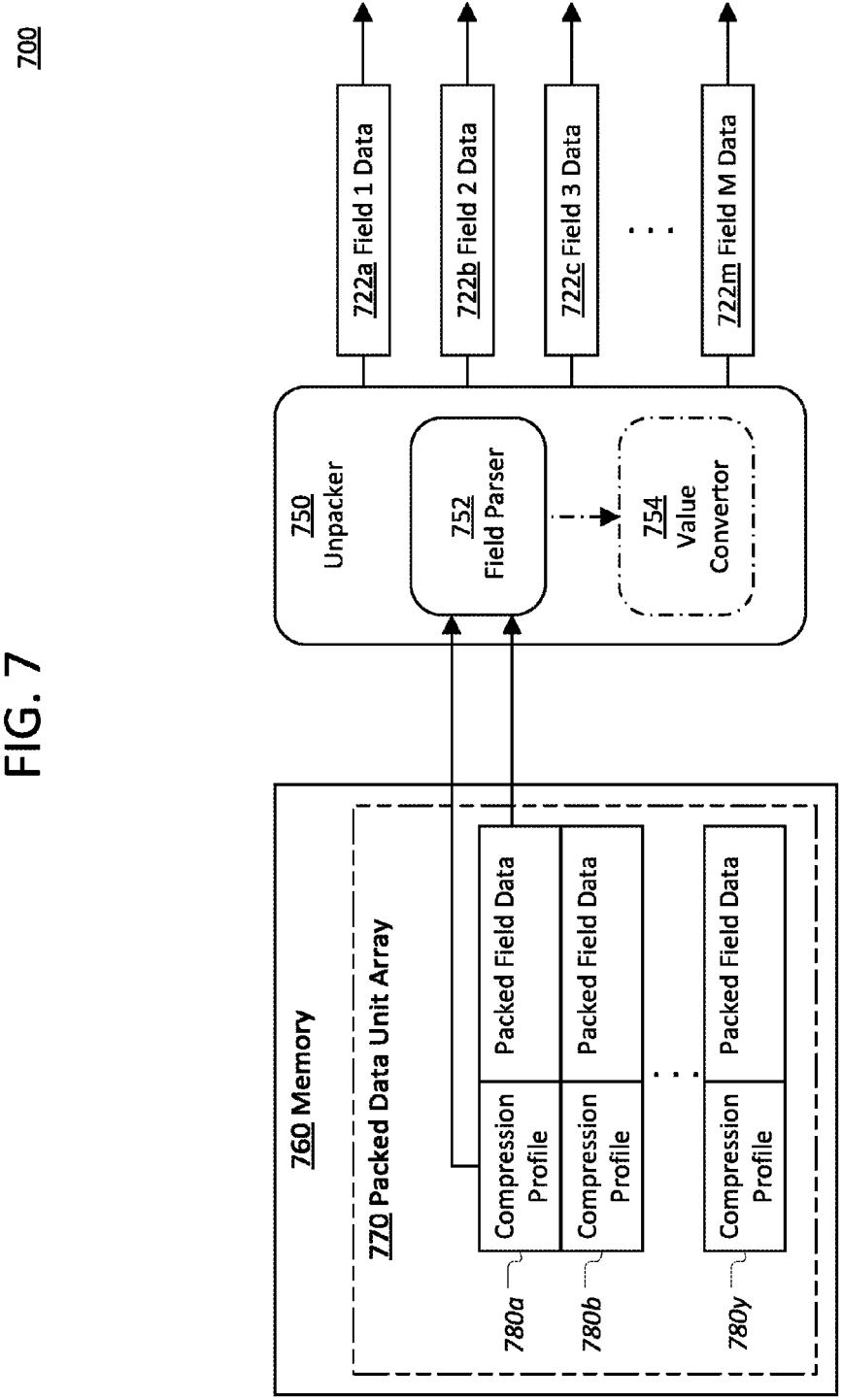
FIG. 7 is an illustrative view of various aspects of an example subsystem for decompressing packed data units.

FIG. 7 is an illustrative view of various aspects of an example subsystem 700 for decompressing packed data units, according to an embodiment. Subsystem 700 is configured to decompress, or "unpack," data units in an array 770 of data units 780, which may be stored in any suitable memory 760, such as DRAM, SRAM, registers, and so forth. For instance, array 770 may be a table of rules or policy data, a queue of packet headers, or any other suitable set of data units. In some embodiments, array 770 need not be a physical data structure that exists at any given moment of time. Rather, inputs into subsystem 700 may be controlled by another component which releases data units 780 serially to subsystem 700, and array 770 is essentially a conceptual illustration of a group of data units 780 dispensed to subsystem 700 over time.

While the section on compression above sets forth example contexts for creating arrays of packed data units, such as arrays 170 and 270, subsystem 700 is actually agnostic to the manner in which array 770 is generated. In fact, the packed data units may be generated at an entirely different system, and transmitted to an apparatus comprising subsystem 700.

From the perspective of subsystem 700, then, the operating constraints are as follows. An array 770 exists of Y data units 780, each of width W (or less). Each data unit 780 in the array 770 can consist of data for N distinct fields from a master set of M fields. The total width of the fields stored in a data unit 780 must be equal to or less than W. N is different for each data unit element in the array 770, and there can be distinct combinations of fields across different elements of the array 770. The number of fields stored in each data unit 780, and the combination of fields from the master set that make up a data unit may be determined at runtime and in such cases cannot be statically allocated. The packed width of fields from the master set can be variable and determined at runtime.

3.1. Data Unpacker

Subsystem 700 comprises an unpacker component 750. Unpacker 750 may, for example, be implemented by one or more Field Programmable Gate Arrays ("FPGA"), Application Specific Integrated Circuits ("ASIC"), or other specialized circuitry within a computing device. Unpacker 750 is configured to receive, as input, selected packed data units 780, or at least components thereof, from the array 770.

For each packed data unit 780 inputted into the data unpacker 750, the data unpacker 750 is configured to unpack the data unit by extracting the values stored in the packed field data of the data unit 780. The data unpacker 750 is further configured to output data reflecting the fields of the unpacked data unit corresponding to the number of fields in the master set. In some embodiments, on account of the hardware implementation, the length of each field when outputted must be of a corresponding fixed size. Each fixed size may, for instance, be defined by a master field specification such as master field specification 110. The data unpacker 750 may thus further be configured to convert the extracted values to the appropriate length.

Data unpacker 750 thus functions to identify the data to output for each field based upon a packed data unit 780 and then deliver that data in the appropriate form to the field data output 722 that is mapped to the field. To this end, data unpacker 750 may be seen as logically, if not physically, comprising a field parser 752 and an optional value convertor 754.

3.2. Field Parser

From a logical perspective, field parser 752 accepts as inputs both a compression profile and packed field data for a packed data unit 780. For example, the packed field data may be a packed data unit 180 or 280, while the compression profile may be a compression profile 140 or 240. In other embodiments, the compression profile is not exactly the same data structure as the original compression profile 140 used during compression, but rather may be a counterpart data structure that includes sufficient information (e.g. instruction sets, field state data, etc.) to extract the values from any packed data unit that was compressed using the original compression profile 140.

In some embodiments the compression profile and/or packed field data may actually be preprocessed before reaching the field parser 752 for various purposes such as described elsewhere in this disclosure. Whatever the case, field parser 752 utilizes field state information described by the compression profile to determine whether data for a field is found in the packed field data. If so, field parser 752 utilizes location information indicated by the profile, such as field ordering data, profile-specific packed field length data, and/or fixed field length data, to compute the location in the packed field data where the corresponding data is found. The field parser 752 then parses the appropriate number of bits from that location to arrive at the value for the field. In some embodiments, the field parser 752 may be configured to parse the bits for a given field from multiple separate locations.

3.3. Value Convertor

Once field parser 752 has extracted a value for a field, the optional value convertor 754 may pad the value with "filler" data, such as extra leading zeros, so as to render the uncompressed field data a fixed length suitable for output to an appropriate field data output 722. Of course, use of the optional value convertor 754 may not be needed in embodiments where the values for a field are always of the suitable fixed length.

In an embodiment, value convertor 754 may also be configured to add a validity bit, a value-carrying indicator, to each field. For instance, if a field is 32 bits in length, value convertor 754 may append or prepend another bit with a value of 1 to indicate that the outputted data is valid and a value of 0 to indicate that the outputted data is not valid. Hence, the outputted data for the field will be 33 bits instead of 32 bits.

In some embodiments, a value convertor 754 may employ additional steps to finish "unpacking" the value. For instance, value convertor 754 may reformat the value to a different format, or translate the value to a different domain. As another example, value convertor 754 may indicate that certain extracted bits are to be shifted relative to other bits, and/or that filler data should be inserted in between certain extracted bits for a field. In an embodiment, a profile may indicate that the value extracted for a given field should actually be mapped to specific bits in the middle of the field rather than the upper or lower bits of the field. For instance, the value extracted may be 1010, but the profile may indicate that the value should be offset by two bits—i.e. placed at the third bit of the field rather than the first bit of the field, so as to yield a value of xx1010xx. The remainder bits of the field may be set to 0, or to a value specified by the profile.

As another example, where a more sophisticated compression algorithm has been used, value convertor 754 may cause the value to be decompressed using a corresponding decompression algorithm. As another example, instead of padding a value with "filler" data, the value convertor 754 may pad the value with a profile-specified set of bits that would have been stripped from any data unit matched to the profile during the compression process. Depending on the embodiment, value convertor 754 may be configured with the assumption that it is always required to perform such additional steps for some or all of the fields, or value convertor 754 may be configured to determine whether it is required to perform such additional steps based on information in the compression profile, as described in the compression section of this disclosure.

3.4. Profile Selector

Figure 8:
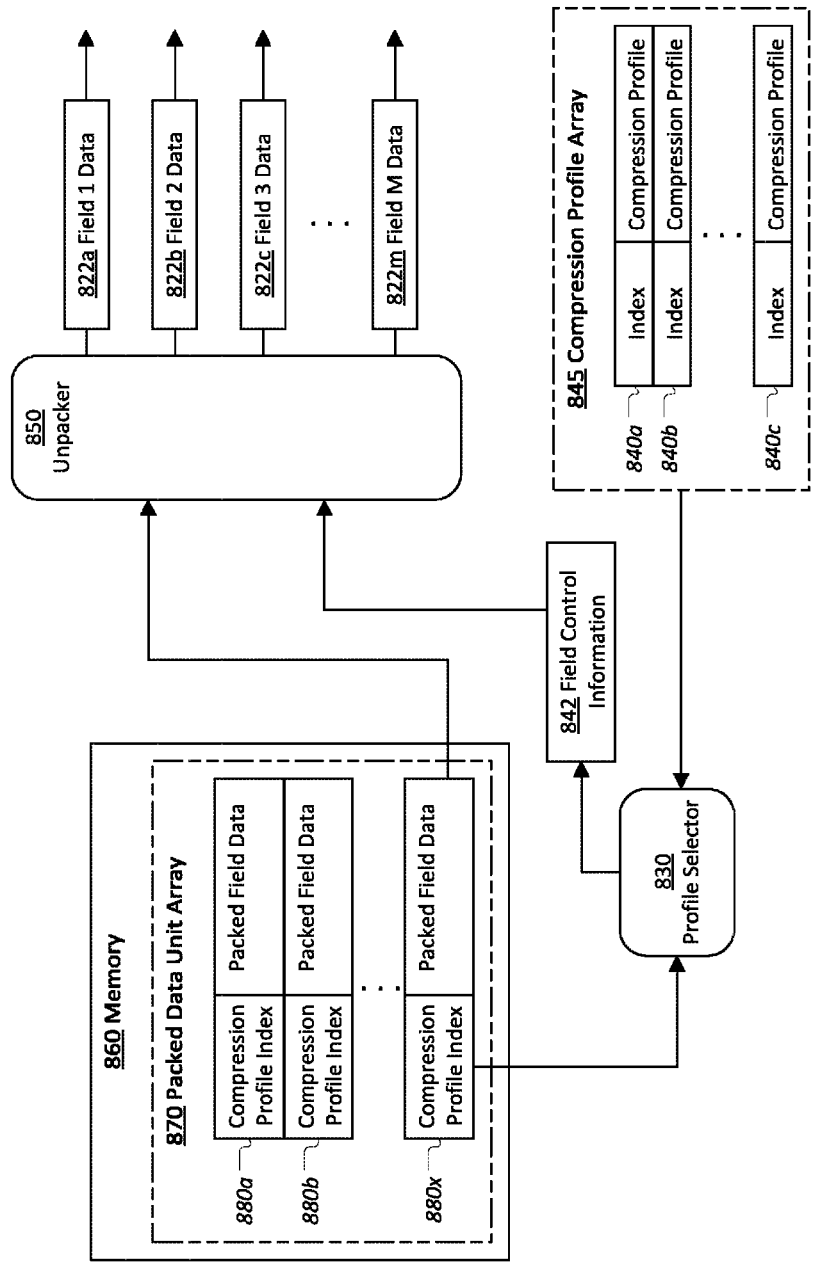
FIG. 8 is an illustrative view of various aspects of another example subsystem for decompressing packed data units with reusable compression profiles.

FIG. 8 is an illustrative view of various aspects of another example subsystem 800 for decompressing packed data units with reusable compression profiles, according to an embodiment. Subsystem 800 is in many aspects similar to subsystem 700. For instance, subsystem 800 comprises unpacker 850, field data outputs 822, memory 860, and packed data unit array 870, which are analogous to unpacker 750, field data outputs 722, memory 760, and packed data unit array 770, respectively.

Subsystem 800 processes packed data units 880, which are similar to packed data units 780, except that they comprise a compression profile index rather than a compression profile. Accordingly, subsystem 800 further comprises a profile selector 830. Profile selector 830 may, for example, be implemented by one or more Field Programmable Gate Arrays ("FPGA"), Application Specific Integrated Circuits ("ASIC"), or other specialized circuitry within a computing device, or by specialized software components executed by a computing device. While depicted as separate logical components for illustrative purposes, in some embodiments profile selector 830 and unpacker 850 are a single, integrated component.

Profile selector 830 is configured to receive or otherwise access the compression profile index stored in the packed data unit that is being processed by unpacker 850. Based on this index, profile selector 830 locates an associated profile 840 in a compression profile array 845. Compression profile array 845 may be stored in any suitable memory. Each compression profile 840 includes field state data as described in other sections. Compression profile array 245 is one example of a suitable compression profile array 845.

Based upon the selected profile 840, profile selector 830 is configured to send field control information 842 to the unpacker 850. The field control information 842, reflects the selected compression profile 840, and may take the form of the compression profile 840 itself, extracted field state data, actual instructions for parsing fields, or any other suitable form. Based on the field control information 842, the unpacker 850 is then configured to unpack the packed data unit, as described in other sections.

3.5. Example Process Flows

Figure 9:
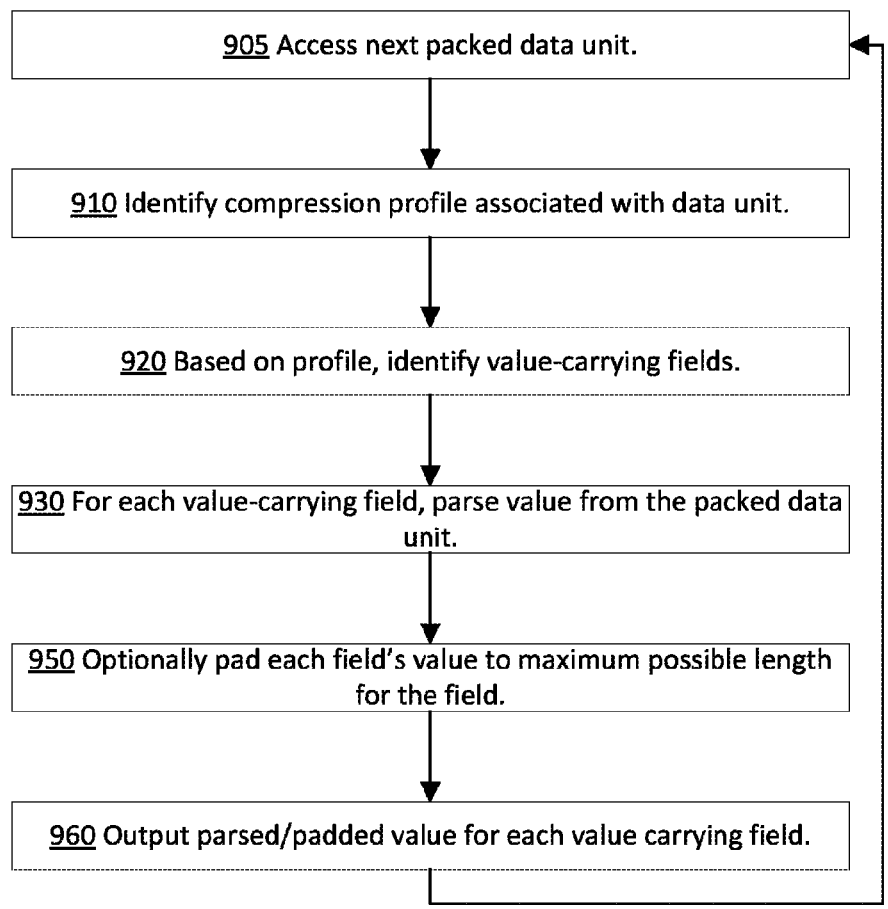
FIG. 9 illustrates an example flow for decompressing packed data units.

FIG. 9 illustrates an example flow 900 for decompressing packed data units, according to an embodiment. The various elements of flow 900 may be performed in a variety of systems, including systems such as systems 700 and 800 described above. In an embodiment, each of the processes described in connection with the functional blocks described below may be implemented using one or more computer programs, other software elements, and/or digital logic in any of a general-purpose computer or a special-purpose computer, while performing data retrieval, transformation, and storage operations that involve interacting with and transforming the physical state of memory of the computer.

Block 905 comprises accessing the first or next data unit in an array of packed data units. For instance, an unpacker 850 may read a packed data unit 880 from memory 860. Block 910 comprises identifying a compression profile associated with the packed data unit. For instance, the compression profile may be embedded within the first or last bits of the packed data unit. Or, the compression profile may be identified using a compression profile index embedded within the packed data unit. The compression profile index may be used to lookup the compression profile in an array of compression profiles.

Block 920 comprises, based on the profile, identifying value-carrying fields within the packed data unit. For instance, field state data within the profile may indicate, for each field in the master set, whether data for the field is found in the packed data unit. Block 930 comprises, for each value-carrying field in the packed data unit, parsing a value from the packed data unit. The parsing may be based on location information indicated by the compression profile, as well as profile-specified length information or fixed length information, as described in other sections.

Block 950, which is optional depending on the embodiment, comprises padding each field's value to a fixed length expected for that field. For instance, the fixed length may be defined by a master field specification, or defined to be a number of bits that are expected for the field by a destination component to which the value will be output. The padding may comprise adding leading zeros to the value until appropriate length is reached, adding some other set of filler bits that will not be interpreted as changing the underlying value of the field, or adding some profile-specified set of bits. In some embodiments, the padding may be performed at locations other than the leading bits, such as in between extracted bits or at the end of a field, depending on instructions from the profile.

Block 960 comprises, for at least each value-carrying field, outputting the corresponding identified value, as parsed and optionally padded or otherwise manipulated in the previous blocks. For instance, each field's value may be sent to an output mapped to that field, such as field outputs 822. In an embodiment, null values may be sent to field outputs 822 for non-value carrying fields. In another embodiment, a validity bit is included in the data sent to each field output 822 (thus extending the size of the field data that is output) indicating whether the field is value-carrying or not. In yet another embodiment, no data is output for non-value carrying fields.

Flow then returns to block 905 for processing the next data unit.

Figure 10:
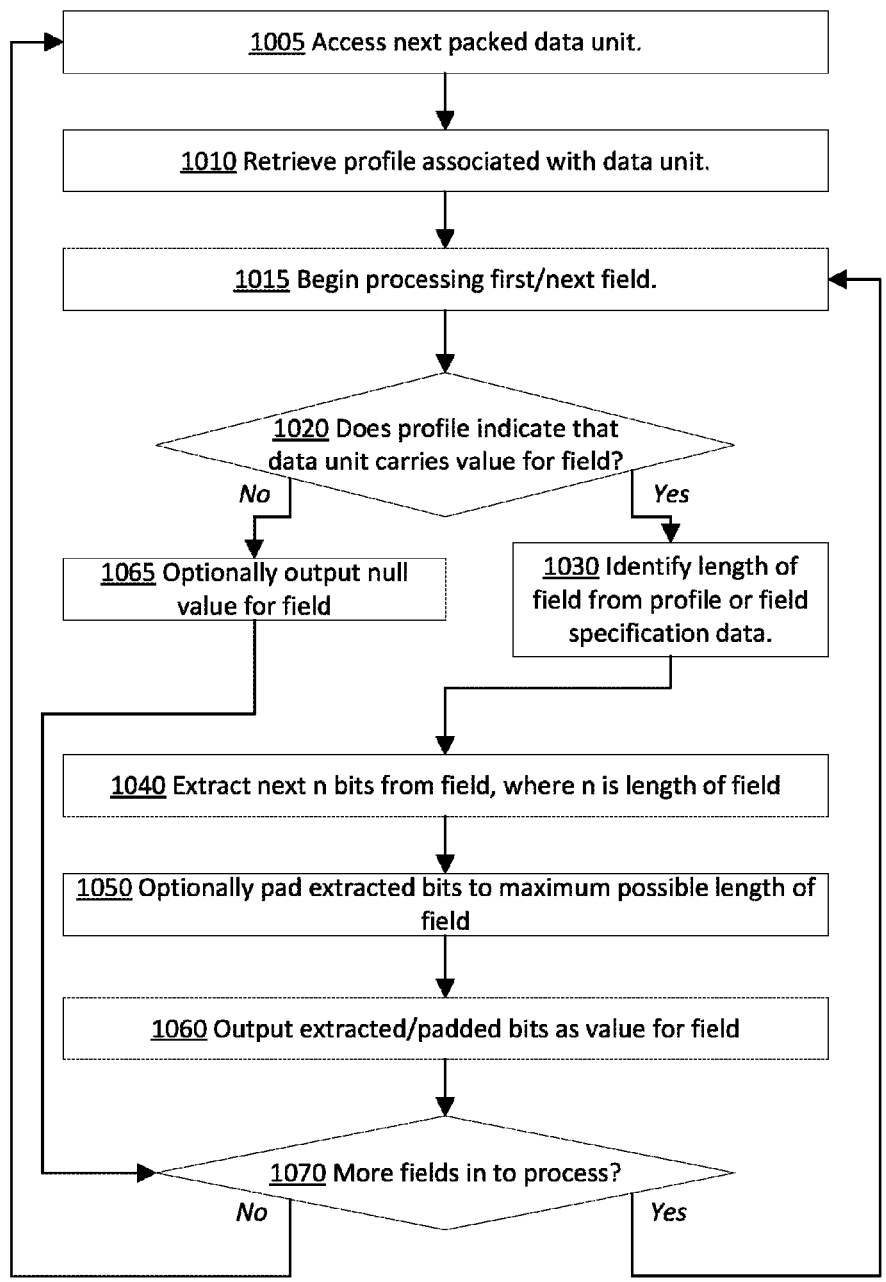
FIG. 10 illustrates another example flow for decompressing packed data units.

FIG. 10 illustrates another example flow 1000 for decompressing packed data units, according to an embodiment. Flow 1000 may be considered a specific example of how flow 900 may be implemented.

Block 1005 and 1010 proceed as with blocks 905 and 910. Once the data unit and the corresponding profile have been identified, flow 1000 proceeds to iterate through each field in a master set of fields. Blocks 1015 comprises identifying the first or next unprocessed field in the master set of fields. In some embodiments, the fields are processed in a specific order corresponding to the order in which they are sequenced by the profile.

Block 1020 comprises determining whether the profile indicates that the packed data unit carries a value for the current field. The profile may indicate this information in a variety of manners described elsewhere in the disclosure. If the packed data unit carries a value for the field, then flow proceeds to block 1030. Otherwise, flow proceeds to block 1065, which comprises optionally outputting a null value or any other value considered to be invalid.

Block 1030 comprises identifying the packed length of the value for the field within the packed data unit based on data in the profile or in the master field specification. Block 1040 then comprises extracting a set of bits from the field equal in number to the packed length of the field, as identified in block 1030. Depending on the embodiment, the bits may be extracted from the front of the packed data unit or the end of the packed data unit. In yet another embodiment, the bits may be extracted from any location within the packed data unit.

Block 1050 comprises optionally padding the extracted bits to reach the fixed length defined for the field, in similar manner to block 950. Block 1060 comprises outputting the field data for the field to the corresponding mapped field output, in similar manner to block 960. Block 1065, which is optional and performed only if the packed data unit does not include a value for the field, comprises outputting a null value for the field.

Block 1070 comprises determining whether there are additional fields in the master set to process. If so, flow returns to block 1015 for processing the next field. Otherwise, flow proceeds to block 1005 for processing the next packed data unit.

Flows 900 and 1000 are but examples of process flows that are suitable for decompressing data units, according to embodiments. Other process flows may also or instead be utilized to decompress data units, including flows with fewer or additional steps, in varying arrangements.

4.0. IMPLEMENTATION EXAMPLES AND OPTIMIZATIONS

4.1. Example Use Cases

According to an embodiment, the subsystems described herein may be advantageously deployed in hardware within network infrastructure devices, such as routers or switches, to allow those network infrastructure devices to store larger sets of certain types of data units within relatively faster but more expensive memories. The hardware implementation greatly reduces the overhead associated with decompressing the data units, allowing the network infrastructure to continue to route data packets and/or apply policies to those data units with acceptable speeds. Meanwhile, the increased capacity for storing larger data sets allows the network infrastructure devices to implement more complex rules, policies, and filters. The increased capacity may also or instead increase the amount of data that may be buffered and/or cached at the network infrastructure devices, thus increasing the effective throughput of the network infrastructure devices.

For instance, in an embodiment, packets processed by a network infrastructure device are associated with a Virtual Network Identifier (VNI). For each VNI, an entry in a VNI Table stores policies and attributes to be applied to packets belonging to that VNI. There can be a large set of policies and attributes across all VNIs, such as drop actions, forwarding policies, learn policies, counter indexes, controls, and so forth. However, for each VNI only a subset of the policies and attributes apply. Accordingly, the VNI table may be stored in a compressed form using the techniques described herein. One or more FPGAs, ASICs, or other specialized circuitry within the network infrastructure device may thus be configured to implement the described compression subsystem and/or decompression subsystem for compressing and/or decompressing VNI entries. Accordingly, the VNI table may be larger and/or stored in a faster memory than it might otherwise have been.

As another non-limiting example, each data unit in the array may be Packet Encapsulation Headers and instructions for how to edit packets forwarded towards a nextHop router. There is a large set of packet edit instructions and type of packet encapsulation headers across all the nextHops. However for each nextHop, there is only a subset of Packet Encapsulation Header types and edit instructions. Accordingly, the network infrastructure device may benefit from inclusion of hardware-based subsystems configured to compress and/or decompress the Packet Encapsulation Headers and instructions.

In other embodiments, other types of computer apparatuses may also benefit from implementation of the subsystems and techniques described herein. Moreover, in other embodiments, certain network devices and computing apparatuses may still derive at least some benefits from software-based implementations of the described techniques.

4.2. Advanced Compression Schemes

According to an embodiment, the field state data may specify multiple subportions of a field's data that should be included in a packed data unit, in contrast to other subportions of the field data that should be ignored. For example, the field data for a certain field in a certain type of data unit may always comprise two or more discrete subportions in which significant bits may be found, separated by portions that are always insignificant (e.g. always equal to zero or always equal to the same value). The field state data for such a field may include multiple pairs of extraction offsets and extraction lengths, each indicating a different subportion of the field to extract. For instance, for a certain profile, the field data for a certain field may always conform to the format 00xxx000xx, where x stands for a significant bit (i.e. a 0 or 1, depending on the value represented). The field state data may specify that a subportion of three bits in length, starting at the third bit of the field data, should be extracted and placed in the packed data unit, followed by a second subportion of two bits in length, starting at the second to last bit of field data, thus yielding the packed data of xxxxx. Or the field state data may specify that two bits should be ignored, followed by three bits extracted, followed by three bits ignored, and followed by two bits extracted. Of course, any other suitable instructions may be used. Any number of significant subportions may be extracted for a given field in this manner. The data unpacker may utilize such field state data in reverse, to reinsert the non-value-carrying bits (e.g. by shifting the subportions relative to each other or performing other suitable operations).

In many examples in this disclosure, for illustrative purposes, the bits to be discarded (i.e. the insignificant or non-value-carrying bits) are depicted as being set to 0. However, insignificant or non-value-carrying bits may be discarded regardless of whether the bits are set to 0 or 1. In some embodiments, these bits may be discarded because it truly does not matter what the values of those bits are. Being able to rely upon the insignificant bits as being set to 0 does make possible embodiments where the non-value-carrying bits of a data unit may be identified based on an analysis of the data unit itself. However, since in other embodiments metadata describing a data unit may be used to determine when a subset of bits is value-carrying, it is not necessary that the non-value-carrying bits actually be set to 0.

In some embodiments, however, a profile may indicate to ignore certain bits when creating a packed data unit not because the bits are non-value-carrying, but instead because the bits will always be the same for any data unit that is matched to the profile. In such an embodiment, the profile may include instructions that indicate where such bits are located, and what the values of these bits should be. For instance, for a given profile, the field data for a certain field may always have the format 1010xxxx. The profile may indicate that the bits xxxx are to be included in the packed data unit, and that the bits 1010 should proceed bits xxxx when the data unit is decompressed. In other words, the profile may indicate that the data packer should pad the field with the bits 1010 instead of 0000.

In yet other embodiments, any compression scheme describable by a profile may be utilized.

4.3. Data Packer Example

According to an embodiment, a data packer component is configured to utilize a given profile to compress a vector of size V bits to a packed data unit. The vector and profile are inputted to the data packer. The profile includes a plurality of instruction sets, each corresponding to a different field. Each instruction set specifies, implies, or otherwise indicates, for its field, at least a field start offset in the vector at which the data for the field is located, an extraction length equaling the number of bits to extract for that field, and a target offset within the packed data unit at which the extracted bits are to be placed. The data packer determines a length N for packed data unit by adding up the extraction lengths for all fields described by the profile. The data packer initializes a packed data unit of size N bits to a value of all zeros.

The data packer iterates through each instruction set in the profile. Each iteration involves a shift operation on the vector. The shift operation may be performed on a new copy of the vector for each iteration, or the previously shifted vector may be utilized, in which case a current vector offset is utilized to track how far the vector has already been shifted. For example, for each instruction set, based on the field start offset and, optionally, the current vector offset, the data packer may determine a shift direction and a shift amount to shift the vector in order to place the bits to be extracted at the target offset within the lower N bits of the vector. Valid shift directions are left and right. Valid shift amounts are from 0 to V−1. The data packer then shifts the vector in the shift direction by the determined shift amount.

For each instruction set, the data packer also performs a mask operation to mask out any bits that do not carry the value to be extracted for the field corresponding to the currently iterated instruction set. The data packer may, for example, determine a mask length L and mask start offset for use with the instruction set. Valid values for both are from 0 to N−1. A mask of N bits is generated, in which L consecutive bits are assigned to 1, starting at the mask start offset, but all other bits are set to zero. The mask length and mask start offset are determined from the profile's target offset and the extraction length such that the is cover the extracted bits. That is, the mask length is the extraction length. The data packer then performs an AND operation between the mask and the lower N bits of the shifted vector.

The data packer then performs bitwise operation(s) to load the extracted value into the packed data unit. For instance, the data packer may perform an OR operation between the previously initialized packed data unit, as modified from any previous iterations, and the N bits that were output from the AND operation. The result of the OR operation is kept in the packed data unit, and the data packer repeats the above processes for each instruction set. After all instruction sets are processed, the resulting packed data unit is then stored or passed on to another processing component, depending on where the data packer is deployed.

The above embodiment is but one example of how a data packer may be implemented. A variety of other embodiments exists. For instance, different combinations of masks and bitwise operations may produce equivalent results. As another example, the logic may be configured such that the value-carrying bits are shifted into upper N bits of the unpacked data unit instead of the lower N bits.

More generally, the data packer may be configured to, for each value-carrying field, loading value-carrying bits from the unpacked data unit into a target offset within the packed field data by performing one or more shift operations on the unpacked data unit, one or more mask operations on the unpacked data unit, and one or more merge operations (e.g. bitwise operations) to merge the packed field data and a result of the one or more shift operations and the one or more mask operations, the result of the one or more merge operations replacing the packed field data.

4.4. Modular Data Packer

In the above-described iterative implementation, if there are X instruction sets, then the data packer must perform X sequential iterations for each instruction set. The amount of time the data packer requires to pack a single data unit obviously increases with the size of X. For larger vectors, such as vectors on the order of a few kilobits, the delay introduced by such a data packer may be undesirable.

As an alternative, the data packer may be implemented using modules that act in parallel upon X separate copies of the data unit. Each module executes the shift and mask logic with respect to a different instruction set on a separate copy of the data unit. Each module thus arrives at a result of size N bits (N being the expected size of the packed data unit) that encodes the data for a single field (if the field is value-carrying) at the profile-specified target offset, but is otherwise set to zero. The data packer then performs a bitwise OR between the X results to arrive at the packed data unit. Such a data packer obviously reduces the total amount of time to pack a data unit, but may also greatly increase the resources necessary to implement the data packer.

Yet another alternative would be for the data packer to include K modules capable of executing the shifting and masking logic in parallel on their own copies of the data unit. The X instruction sets are divided amongst the K modules, each requiring no more than X/K iterations to produce a result. The data packer may then perform a bitwise OR operation on the results from the modules.

Container-Based Packing

Conceptually, a profile may indicate both instructions for packing a data unit and instructions for unpacking individual fields from the data unit. In many of the examples given herein, these instructions are synonymous—in other words, instructions for unpacking individual fields are simply the "reverse" of the instructions for packing a data unit. In some embodiments, however, this is not necessarily the case. For instance, in at least one embodiments, a concept of containers is used for packing a data unit, and the profile thus contains container-based compression instructions. In an embodiment, a data packer that utilizes container-based packing may be improved using modular packing logic. The container-based data packing scheme is thus described with respect to a modular data packer, though it may also be used without a modular data packer.

The container-based data packing scheme involves dividing a vector into a number of containers indicated by the container-division instruction(s) in the profile. A given container may include a single field, multiple fields, or portions thereof. Some containers may span only a subportion of a field. The container-division instruction(s) may simply specify a number of containers to create, or a desired container size, and the boundaries of each container may thus be calculated based thereon. Or, the container-division instructions may actually specify a size for each container, or a boundary for each container.

According to an embodiment, the container-division instructions may have been created based on information known about the vectors that match the profile. For instance, container sizes may be selected such that portions of the vector known to at least potentially compress well together are placed in a single container. Thus, for instance, a first container may be of a default size of 128 bits. A second container may be of size 32 bits if the next 32 bits are known to correspond to one or more densely-populated fields. A third container may be of 256 bits if the next 256 bits are known always be 0 except for only one value-carrying field. The remaining containers may be of the default size, or further customized in similar manner.

Once divided into containers, the vector is compressed on a container-by-container basis rather than on a field-by-field basis (though, of course, in some cases the boundaries of a container may be the same as those of a field). The container-based compression instructions include, in addition to the container-division instructions, container-relative extraction location information that indicates what data to extract from the container for inclusion in the packed data unit. A container is then compressed in similar manner to a field, using extraction location information as described elsewhere in this disclosure, though with respect to the container rather than a field. Any suitable compression technique may be used with respect to the container, including specifying multiple extraction locations, removing bits that will always be set to the same value, and so forth. In an embodiment, a data packer includes multiple modules, each configured to compress a different set of one or more of these containers in parallel.

As an example of the container-based approach, a vector may be divided into R segments of T bits. For instance, a 4096-bit vector can be divided into sixty-four 64-bit segments where segment 0 consist of bits 0-63, segment 1 consist of bits 64-127, and so forth. The modular data packer includes C containers of size T bits, where C is some number greater than the number of fields from a master set that will be stored in the packed data unit. A modular data packer profile stores the size N of the packed data unit N, or this can be inferred by a particular instantiation of the modular data packer. The modular data packer profile further stores, for each container C: a container segment offset relative to the entire vector, indicating which segment R to write into the container; a container shift amount ranging in size from 0 to N−1, a container mask start offset ranging in size from 0 to T−1, and a container mask length L ranging in size from 0 to T−1. This information may be separate from the field extraction length and target offset information that will be used to decompress the packed data unit, since the containers may not necessarily have a one-to-one mapping to the fields.

The modular data packer initializes the packed data unit to N bits of 0. The modular data packer comprises C modules that are assigned to the C containers. In parallel, these modules process their respective containers as follow. A module generates a container mask of size T bits, in which L consecutive bits are assigned to 1, starting at the container mask start offset, but all other bits are set to zero. The consecutive bits can be in increasing offsets or decreasing offsets. The module performs an AND operation between the container mask and the original container to generate a masked container.

Each masked container is then processed in parallel. If T is less than N, then each container is padded with N−T bits of leading zeros to form a value of size N bits. If T is greater than N, then no padding is necessary. The module processes the masked container then left shifts the result by the container shift amount. Finally, the data packer performs a bitwise OR to merge all of the shifted containers together. The result is the final compressed data unit.

Of course, other implementations are possible. For instance, extending the masked container by trailing zeros and performing a right shift would also be a valid implementation.

In an embodiment, as indicated above, the profile may specify variable size containers. For instance, some containers may be of size T bits, while others may be of size T/4 bits, yet others may be of size 2T bits, and so forth. The implementation may also be extended into multiple stages. For instance, during a first stage a first-processing data packer may condense 4K bits to 512 bits, and during a second stage a second-processing data packer may condense the 512 bits to 50 bits. The first stage may, for instance, involve large container sizes, shifted by low granularity amounts such as multiples of 4 or 8 bits. The second stage may, for instance, involve smaller container sizes and shift amounts of lower granularity, such as single bits.

The unpacking instructions (e.g. field state data, instruction sets, etc.) used for unpacking field data from the data unit once compressed will typically be different than the container-based compression instructions, and thus stored separately within the profile. Or, there may be two profiles associated with data unit—a compression profile with container-based compression instructions for compressing the data unit, and a decompression profile with field-based unpacking instructions for unpacking the field data from the packed data unit. In any event, though the unpacking instructions must be created based on knowledge of how where the field data for each field will be stored relative to compressed containers, the data unpacker may be agnostic to whether the containers were used to pack the data unit, as the containers need not be reconstructed during the unpacking process.

In some cases, particularly those where the profile divides the vector into containers using a relatively simple scheme (e.g. equally-sized containers), compression of the vector on a container-by-container basis may not necessarily produce a packed data unit that is compressed as optimally as one compressed on a field-by-field basis. However, because the cost of dividing up the vector into such containers may be less than that of dividing the vector into fields, the container-based approach may produce close to optimal results more efficiently than the field-by-field approach. On the other hand, in some cases, certain fields that would be difficult to compress by themselves may be divided into multiple containers that are much more easily compressed. Thus, in such cases, the container-based division of the vector may actually deliver better compression results than a field-based division. However, such cases may often require more complex logic to divide the vector into containers that will achieve the desired result, thus increasing the expense of the compression process.

4.5. Example Data Unpacker

Although the field parser and value convertor subcomponents of the data unpacker are described herein in various instances as being separate components, the field parser and value convertor may in fact be a same component, configured to extract the relevant bits for a field and convert the value to conform to an expected output format in the same operation(s). For example, in embodiments where the only conversion needed is to pad a value with extra zeros, the extraction and padding of zeros may be accomplished through the use of masks and bitwise operations, in much the same manner that the data packer compressed the data in the first place.

For instance, in one implementation, the data unpacker may iterate through each field described in the profile. For each field, the data unpacker may perform a shift operation on the packed data unit that shifts the packed data unit a number of bits equal to the target offset within the packed data unit where the packed data for a field is found, or the difference between the target offset and any amount the packed data unit has already been shifted, if the packed data unit is reused in each iteration. This operation places the packed data for the field in the lowest bits of the shifted packed data unit. A mask may be generated in which a consecutive number of bits equal to the size of the packed data for the field are set to 1, beginning with the lowest bit. This leaves a leading number of bits in the mask set to 0. The mask should be the size of the expected field output. The data unpacker performs an AND operation between the shifted packed data unit and the mask. The result of the operation is, in essence, the extracted value already padded with leading zeros. The result may then be sent to the corresponding field output, optionally with the addition of a validity bit, depending on the embodiment.

Of course, a variety of other implementations are possible, including implementations that make use of different masks, combinations of bitwise operations, and so forth. Hence, more generally, the data unpacker may be configured to extract value-carrying bits for a field by performing one or more shift operations and one or more mask operations indicated by target offset and extraction length information in the compression profile.

4.6. Partially-Packed Data Units

According to an embodiment, in spite of the optimizations described herein, the unpacking of a data unit nonetheless introduces unavoidable latency to the processing of that data unit. This latency may be acceptable for certain types of data units, or at least for certain less significant fields of a data unit. On the other hand, the latency may be mitigated by only partially packing the data unit, such that higher priority fields are stored fully and uncompressed. Processing of the higher priority fields may thus begin immediately, while the lower priority fields are still being unpacked. Ideally, the unpacked data units may not be needed for processing until after they have already been unpacked. However, even if the packed fields have not been unpacked before the system is ready for them, this technique will still reduce the overall processing time for the data unit.

Figure 11:
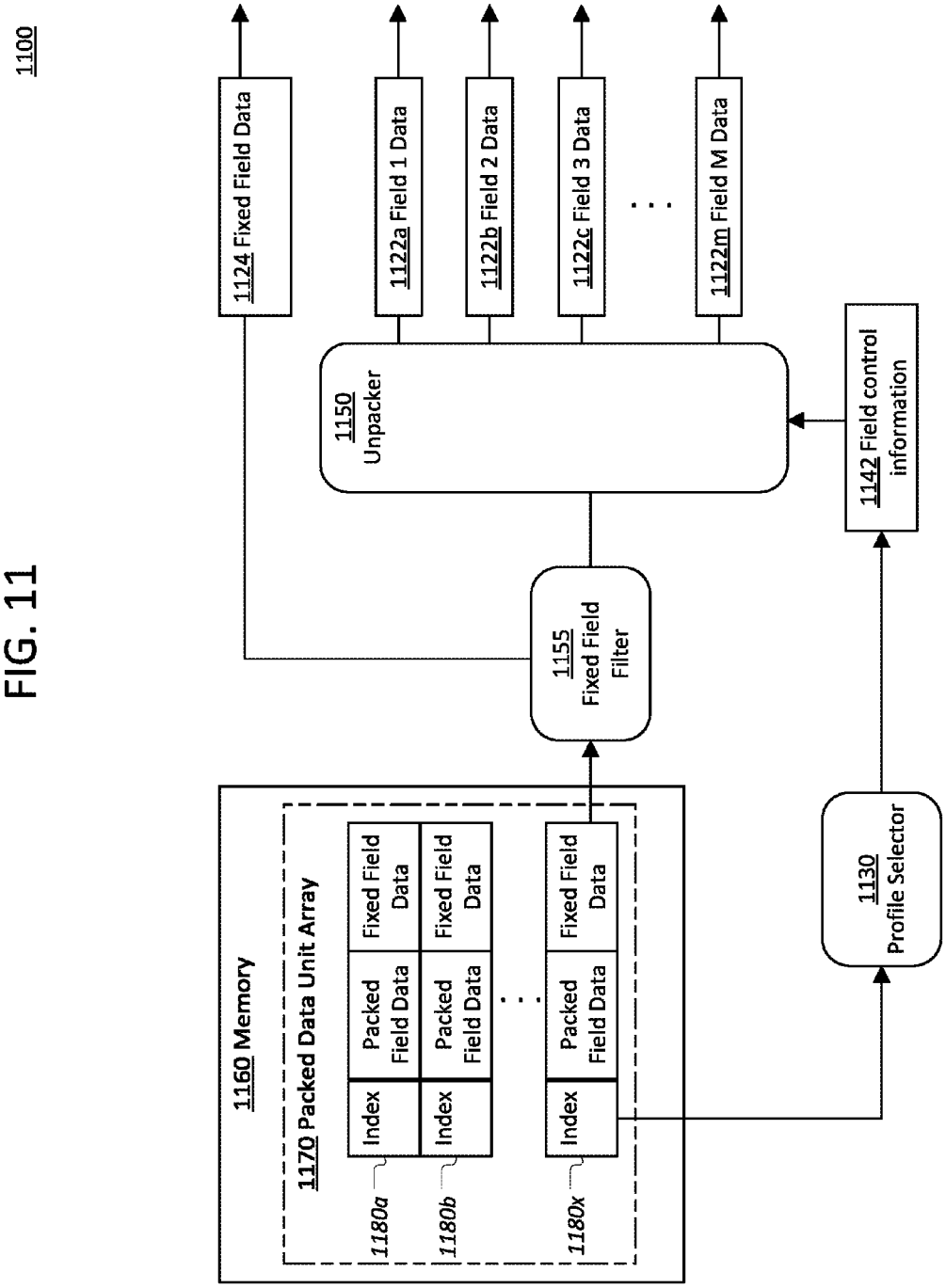
FIG. 11 is an illustrative view of various aspects of an example subsystem for decompressing partially-packed data units.

FIG. 11 is an illustrative view of various aspects of an example subsystem 1100 for decompressing partially-packed data units, according to an embodiment. System 1100 comprises many components similar to those in system 800. For instance, system 1100 comprises a memory 1160, packed data unit array 1170, profile selector 1130, field control information 1142, unpacker 1150, and field data outputs 1122, which are analogous, respectively, to memory 860, packed data unit array 870, profile selector 830, field control information 842, unpacker 850, and field data outputs 822.

However, the data units 1180 within array 1170 are only partially packed. That is, in addition to including a compression index and packed field data, data units also includes one or more subunits of fixed field data that has not been packed. The one or more subunits of fixed field data correspond to one or more high priority fields that need not be processed by the unpacking logic of unpacker 1150. The fixed fields are the same for each data unit in the array. The fixed field data is neither omitted when not carrying a value, nor condensed or otherwise processed during the compression stage, except if needed to ensure that the fixed field data is ready for use by the components to which the fixed field data will be directed. The compression profiles may or may not indicate the presence of fixed fields, depending on the embodiment.

Subsystem 1100 comprises a fixed field filter 1155. As with other components of subsystem 1100, fixed field filter 1155 may be implemented by one or more Field Programmable Gate Arrays ("FPGA"), Application Specific Integrated Circuits ("ASIC"), or other specialized circuitry within a computing device. Moreover, though depicted as logically separate components, fixed field filter 1155 may be integrated with one or both of unpacker 1150 and profile selector 1130.

In an embodiment, a data unit passes through fixed field filter 1155 before delivery to unpacker 1150. The fixed field data is stripped from the data unit and directed to one or more fixed field data outputs. These outputs are coupled to other processing components, which begin processing the fixed field data in parallel with unpacker 1150 unpacking the packed field data in the remainder of the data unit.

As depicted, the fixed field data is found in the least significant bits of each partially packed data unit, for ease of extraction. That is, the data unit has been partitioned such that the lower L bits are fixed, while the upper U bits are governed by the unpacker. However, in other embodiments, the fixed field data may be stored in other locations within the partially packed data unit.

The selection of which field(s) should be packed rather than fixed will be highly dependent on the nature of the packed data units and the overall system in general. The selection will typically involve individual experimentation for the specific type of data unit being processed. For instance, for a certain type of data unit that always has values for certain types of fields, such as the IP source address or destination address in a packet header, it may make sense to not pack these fields, since the IP source address and destination address may both be needed relatively early in the processing of the data unit, and would in any event not likely save much room if packed. Other non-limiting examples of field types that may be useful to store as fixed fields may include protocol indicators, version indicators, type indicators, and so forth, upon which processing logic may branch relatively early in the processing of the data unit. On the other hand, expected reductions in latency must be carefully balanced against increased data unit sizes in storage.

Figure 12:
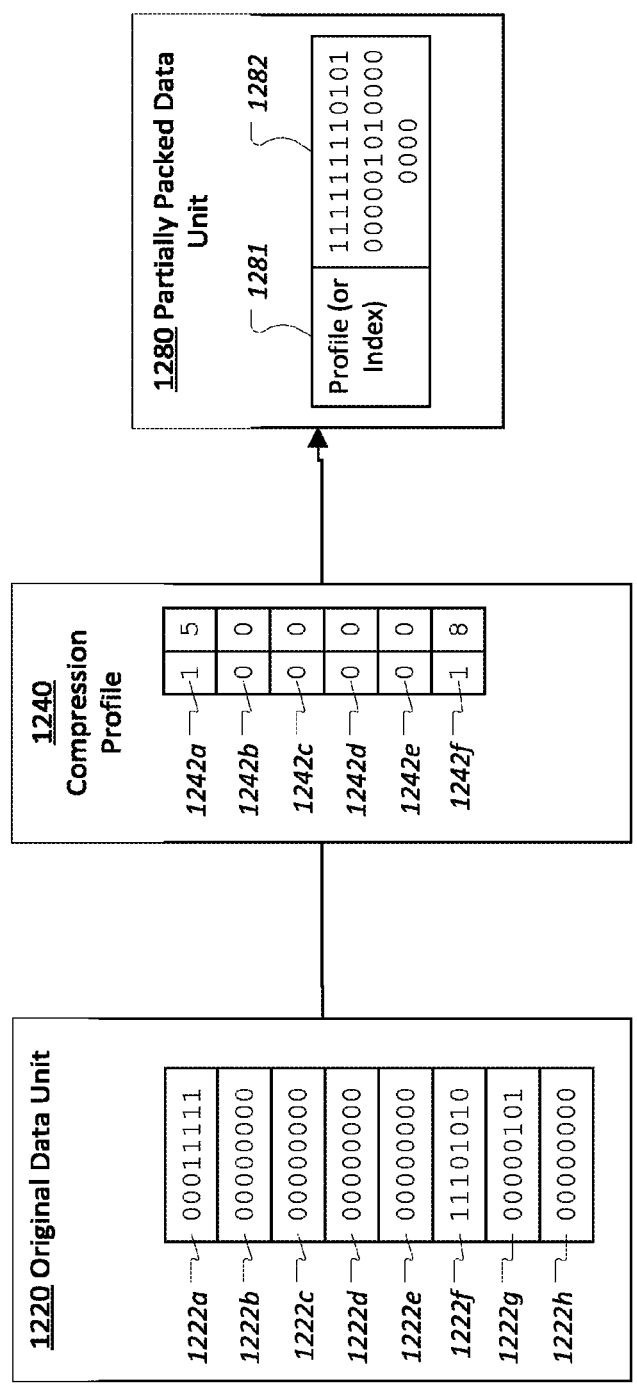
FIG. 12 is a block diagram illustrating an example partially packed data unit.

FIG. 12 is a block diagram 1200 illustrating an example partially packed data unit 1280, according to an embodiment. The original data unit 1220 is the same as the original data units 520 and 620. The compression profile 1240, however, omits field state data 1242 for fields 1222g and 1222h, which have been designated as fixed fields. Moreover, in the packed data unit 1280, both of these fields are stored in complete form, even though field 1222g could be compressed in length, and field 1222h would have been omitted entirely in a fully packed data unit.

4.7. Pipelined Unpacker

The latency to unpack a data unit grows with the length of the packed data unit and the number of fields that are possible in the master set. One enhancement to minimize the increase in latency for larger data units or master field sets is to implement a "pipelined" unpacker. The unpacker unpacks fields in multiple stages. A first stage unpacks relatively critical fields from a timing perspective. For instance, the first stage may unpack a set of N fields found at the least (or most, depending on the embodiment) significant bits of the data unit. Additional stage(s) may iteratively process additional fields that are less critical from a timing perspective.

4.8. Nested Unpackers

According to an embodiment, a data unit may be unpacked using nested compression profiles and unpackers. A compression profile index is stored with the data unit. However, the referenced profile may only unpack a variable segment of the data unit. The profile may then indicate that one of the fields that was unpacked is a nested profile index, which is used to unpack the rest of data unit. Any level of nesting may be implemented.

4.9. Parallel Unpackers

According to an embodiment, a large data unit may be divided amongst multiple data buses, each routing a different segment of the data unit to a different unpacker configured to unpack a different set of fields. The unpackers may work in parallel and output different sets of unpacked fields.

In an embodiment, a "two-directional" pair of unpackers may be utilized in parallel, one operating in reverse of the other. The compression profile indicates, either directly or indirectly, unpacking instructions relative to both the upper bits of a packed data unit and the lower bits of the packed data unit. For instance, a compression profile may indicate a target offset for a field relative to both the upper bits and the lower bits of the packed field data. A first unpacker starts unpacking from the highest bits using the instructions relative to the upper bits, while a second unpacker starts unpacking from the lowest bits using the instructions relative to the lower bits. The unpackers may be configured to continue until they meet somewhere near the middle of the packed data unit. Or, the packed data unit may be divided up front, and the unpackers are configured to only unpack their assigned portions of the packed data unit. Such an embodiment may also be combined with fixed fields. For instance, the middle of the data unit may be passed as a fixed field, while two-directional unpackers are configured to stop when the fixed field is reached, or skip over the fixed field.

4.10. Multiple Data Unpackers

In an embodiment, a computing apparatus may comprise multiple different data unpackers, each configured to unpack different arrays corresponding to different types of data units having different master sets of fields. Data unpackers may be implemented generically, such that they may be applied to any master set of fields of no more than a certain size, and then programmed for a specific type of data (i.e. a specific master set) at runtime. Or, the data unpackers may be hard-coded to function with predefined master sets. In any case, in embodiments, the profiles utilized by a specific unpacker may be bound at runtime and/or modified during runtime.

4.11. Genericized Data Units

According to an embodiment, the types of data units processed by the systems described herein may be expanded by implementing one or more intermediate levels of interpretation between unpacking the field data and utilizing the values stored therein. For instance, a single genericized data unit may be used to represent two or more different types of data units. The generic data unit may include a field that indicates what type of data is represented by the generic data unit. A mapping associated with the indicated data type indicates one or more fields of the generic data unit that should be reinterpreted as specific fields of the indicated data type. The generic data unit fields may be interpreted by one or more hardware layers to which the unpacker outputs the fields, and/or software configured to process the outputs of the unpacker.

For example, a device may utilize the same decompression subsystem to unpack two different arrays of two different data types. From the unpacker's perspective, data units of both types may be treated in the exact same manner. For instance, the data units may be considered as generically holding a "Field A" or "Field B." The unpacker may output the values (if any) of Field A or Field B to one or more interpretation subsystems. An interpretation subsystem is configured to utilize the value of Field A to identify how to handle Field B (i.e. the value indicates the appropriate data unit type). For example, if Field A indicates that the data unit is an IP packet header, Field B might be interpreted as a protocol field, whereas if Field A indicates that the data unit is a rule, Field B might be interpreted as a policy attribute. Based on the value of Field A, the interpretive subsystem may, for instance, determine which of multiple possible subsystems should be responsible for receiving and processing Field B, thus affecting how Field B is interpreted. Of course, Field A may similarly control the interpretation of many more generic fields.

On the other hand, not all fields in the genericized data unit necessarily need to be reinterpreted. For instance, each of the different types of data units may still include a common subset of fields, such as a source address and/or destination address, that are processed in the same manner regardless of the interpreted data unit type. In any event, for data units that comprise fields of different fixed lengths, and/or for optimization purposes, various pre-processing steps may need to be performed prior to compression, such as adding or removing padding to certain fields, reorganizing certain fields, adding empty fields, and so forth, so as to conform the different types of data units to a common generic data structure. Likewise, various corresponding post-processing steps may need to be performed after unpacking the genericized data unit to reverse the transformation.

5.0. EXAMPLE EMBODIMENTS

Examples of some embodiments are provided, without limitation, in the following paragraphs.

According to some embodiments, an apparatus comprises: a profiler configured to associate compression profiles with unpacked data units, each of the unpacked data units having allocated space for storing field data for each field in a master set of fields, but only carrying values for a subset of fields in the master set, each of the compression profiles indicating a specific combination of value-carrying fields in the master set of fields, and specifying packed value lengths for the indicated value-carrying fields; and a data packer component configured to generate packed field data for a given unpacked data unit based on a given compression profile, of the compression profiles, that the profiler associated with the given unpacked data unit, the packed field data including values for the specific combination of value-carrying fields indicated by the given compression profile, the values condensed within the packed field data to corresponding packed value lengths specified by the given compression profile, the data packer component further configured to store or transmit the packed field data in association with information identifying the compression profile.

In at least some of the above embodiments, the apparatus further comprises: a memory storing an array of the compression profiles, wherein the profiler is configured to pass an index to the given compression profile associated with the given data unit to the data packer component, and the data packer component is configured to store or transmit the index in association with the packed field data for the given unpacked data unit.

In at least some of the above embodiments, the profiler is configured to associate the given unpacked data unit with the given compression profile by matching descriptive metadata associated with the given data unit to the given compression profile.

In at least some of the above embodiments, the profiler is configured to generate a new compression profile to associate with a particular data unit when none of the compressions profiles is determined to be suitable for a particular unpacked data unit.

In at least some of the above embodiments, each particular profile of the compression profiles comprises, for each field of at least the specific combination of value-carrying fields indicated by the particular profile, data indicating a field extraction start offset from which to extract bits for the field in particular unpacked data units that are associated with the particular profile, a field extraction length corresponding to a number of bits to extract from the particular unpacked data units, and a target offset corresponding to a location within particular packed data units at which the extracted bits are to be stored.

In at least some of the above embodiments, the target offset is indicated by inference from a running sum of each field extraction length.

In at least some of the above embodiments, each particular profile of the compression profiles comprises instructions for dividing the unpacked data unit into containers, the data packer component comprising modules that separately process each of the containers, the modules are configured to shift and mask data within their respective containers, the data packer component configured to generate the packed field data by merging results from the modules.

In at least some of the above embodiments, for a particular unpacked data unit there are a greater number of containers than value-carrying fields, but a lesser number of containers than fields in the master set.

In at least some of the above embodiments, the apparatus further comprises: a memory storing a packed data array, the packed data array comprising an entry for each data unit of the data units, the entry including specific packed field data for the data unit and either a compression profile corresponding to the compression profile information or an index that references the compression profile, wherein the data packer component is coupled to the memory.

In at least some of the above embodiments, the data packer component is further configured to generate the packed field data by, for each given field of the value-carrying fields in the given unpacked data unit, based on field offset and field length information indicated by the given compression profile, loading value-carrying bits from the given unpacked data unit into a given target offset within the packed field data by performing one or more shift operations on the given unpacked data unit, one or more mask operations on the given unpacked data unit, and one or more bitwise operations to merge the packed field data with a result of the one or more shift operations and the one or more mask operations, the result of the one or more bitwise operations replacing the packed field data.

In at least some of the above embodiments, the data packer component comprises modules that perform said loading in parallel for at least two of the value-carrying fields.

In at least some of the above embodiments, at least a first unpacked data unit of the unpacked data units processed by the data packer component has values for a different combination of fields than a second unpacked data unit of the unpacked data units, the profiler configured to associate the first unpacked data unit with a first compression profile of the compression profiles that specifies a first combination of value-carrying fields, the profiler configured to associate the second unpacked data unit with a second compression profile of the compression profiles that specifies a second and different combination of value-carrying fields.

In at least some of the above embodiments, at least a first unpacked data unit of the unpacked data units processed by the data packer component has values for a same combination of fields as a second unpacked data unit of the unpacked data units, the profiler configured to associate the first unpacked data unit with a first compression profile of the compression profiles that specifies first packed value lengths for the combination of fields, the profiler configured to associate the second unpacked data unit with a second compression profile of the compression profiles that specifies second and different packed value lengths for the combination of fields.

In at least some of the above embodiments, the given compression profile specifies packed lengths for a particular one or more fields, the particular one or more fields including at least two fields for which the given compression profile specifies different packed lengths, the data packer component configured to extract different amounts of bits for each of the at least two fields based on the specified packed lengths.

In at least some of the above embodiments, the given compression profile comprises an entry for each field in the master set of fields, the entry indicating at least whether the corresponding data unit has a value for the corresponding field, and the packed length of that value within the packed field data for the field.

In at least some of the above embodiments, the apparatus is a networking apparatus and the data unpacker component is implemented by a Field Programmable Gate Array or Application Specific Integrated Circuit within the networking apparatus.

In at least some of the above embodiments, the apparatus further comprises multiple data packer components configured to compress an unpacked data unit in sequential stages, the packed field data output by one of the stages being passed as an unpacked data unit to a next stage of the stages.

In at least some of the above embodiments, the data packer component is configured to include first values from a fixed set of fields in the given data unit without condensing the first values.

In at least some of the above embodiments, the given compression profile indicates a given packed data length for a given field by inference from a sum of multiple extraction lengths specified by the given compression profile for the given field, each of the multiple extraction lengths corresponding to a different extraction location within the field data of the given field, the data packing component configured to extract a number of bits equal to the extraction length from the corresponding extraction location to store as part of a given value for the given field within the packed field data.

According to some embodiments, a method comprises: for each vector of a plurality of vectors, each vector having bits allocated for each field in a master set of fields: identifying value-carrying fields for which the vector comprises valid values; identifying lengths of the value-carrying fields; based on the identified value-carrying fields and lengths, associating a compression profile with the vector, the compression profile indicating, for each of the value-carrying fields, at least an extraction offset and an extraction length; generating a packed data unit by, for each field of the value-carrying fields, extracting a number of bits equal to the extraction length for the field from the extraction offset for the field within the vector, and loading the extracted number of bits into a corresponding target location within the packed data unit; storing or transmitting the packed data unit in association with information identifying the compression profile.

In at least some of the above embodiments, the compression profile indicates the extraction offset for each field by specifying a field start offset for the field and a field extraction offset relative to the field start offset of that field.

In at least some of the above embodiments, the compression profile indicates a target offset that indicates the target location.

In at least some of the above embodiments, identifying the value-carrying fields and the lengths of the value-carrying fields comprises receiving descriptive metadata associated with the vector, wherein associating the compression profile with the vector comprises matching the descriptive metadata to the compression profile in an array of pre-defined compression profiles.

In at least some of the above embodiments, the method further comprises associating different vectors of the plurality of vectors with different compression profiles, the different compression profiles specifying different extraction lengths for the same field.

In at least some of the above embodiments, the method further comprises associating different vectors of the plurality of vectors with different compression profiles, the different compression profiles specifying that, for a first subset of the plurality of vectors that is associated with a first profile of the different compression profiles, a first set of fields are value-carrying, and that for a second subset of the plurality of vectors that is associated with a second profile of the different compression profiles, a second and different set of fields are value-carrying.

In at least some of the above embodiments, loading the extracted number of bits into a corresponding target location within the packed data unit comprises performing one or more shift operations on the vector, one or more mask operations on the vector, and one or more bitwise operations to merge the packed data unit with a result of the one or more shift operations and the one or more mask operations.

In at least some of the above embodiments, the method further comprises performing said loading in parallel for at least two of the value-carrying fields.

In at least some of the above embodiments, the compression profile indicates, for a given field of the value-carrying fields, multiple pairs of extraction offsets and associated extraction lengths, the method comprising extracting a corresponding number of bits from each of the multiple extraction offsets.

According to some embodiments, a method comprises: for each particular vector of a plurality of vectors, each particular vector having bits allocated for each field in a master set of fields: based on descriptive metadata associated with the vector that at least indicates which fields in the master set are valid for the vector, associating a compression profile with the vector, the compression profile specifying, for each container of a plurality of containers, a container offset corresponding to the location of the container in the vector, a container shift amount, a container mask start offset, and a container mask length; dividing the vector into the plurality of containers based on the container offsets; for each container of the plurality of containers, generating a container mask based on the container mask offset and the container mask length, applying the container mask to the container, and shifting the masked container by the container shift amount; merging the shifted and masked containers using one or more bitwise operations to generate a packed data unit; storing or transmitting the packed data unit in association with unpacking instructions that identify portions of the packed data unit that map to specific fields in the master set of fields.

In at least some of the above embodiments, the descriptive metadata further specifies extraction lengths for each of the value fields, wherein the unpacking instructions also specify the extraction lengths.

In at least some of the above embodiments, the unpacking instructions indicate, for a given field of the specific fields, a specific subset of bits of the given field that a given portion of the packed data unit corresponds to. In an embodiment, the specific subset of bits does not include the lower and upper bits of the given field, and the packed data unit does not include data corresponding to the lower and upper bits of the given field.

In at least some of the above embodiments, there are more containers than there are valid fields for a given compression profile.

In at least some of the above embodiments, the method further comprises processing each container in parallel.

In at least some of the above embodiments, the method further comprises, based on a first vector and a second vector being associated with different descriptive metadata, associating the first vector with a first compression profile and associating the second vector with a second compression profile that is different from the first profile.

According to some embodiments, an apparatus comprises: a data unpacker component configured to receive packed field data for packed data units, unpack the packed data units into field data for fields in a master set of fields based on compression profiles associated with the packed data units, and output the unpacked field data, each of the compression profiles indicating a specific combination of value-carrying fields in the master set of fields, and specifying packed value lengths for the indicated value-carrying fields, the packed field data for a given data unit of the packed data units including values only for the specific combination of value-carrying fields indicated by a given compression profile associated with the given data unit, the values extracted based on field location information indicated by the given compression profile and corresponding packed value lengths specified by the given compression profile.

According to some embodiments, an apparatus comprises: a data unpacker component configured to unpack at least portions of data units represented by packed field data, each of the data units having values for one or more fields in a master set of fields, the data unpacker component comprising: an input configured to receive particular packed field data for a particular data unit, of the data units; an input configured to receive particular compression profile information associated with the particular data unit; profile processing logic configured to, based on the particular compression profile information associated with the particular data unit, identify for which particular one or more fields, in the master set of fields, the particular packed field data stores values; parsing logic configured to extract values from the particular packed field data for the particular one or more fields that the profile processing logic identifies; outputs, each output of the outputs corresponding to a different field in the master set of fields and configured to, responsive to the parsing logic extracting a particular value for the field corresponding to the output, output data based on the particular value.

In at least some of the above embodiments, the data output based on the particular value is the particular value, includes the particular value, represents the particular value, or is a function of the particular value.

In at least some of the above embodiments, the parsing logic is configured to extract multiple particular values for a particular field corresponding to a particular output, wherein the particular output is configured to output field data that includes the multiple particular values at locations specified by the particular compression profile information.

In at least some of the above embodiments, the apparatus further comprises: a profile selection component, coupled to the data unpacker component, and configured to: receive a particular compression profile index in coordination with the data unpacker component receiving the particular packed field data, the particular compression profile index being associated with the particular data unit; locate a particular compression profile associated with the particular compression profile index in an array of compression profiles; and output the particular compression profile information to the data unpacker component based on the particular compression profile.

In at least some of the above embodiments, the apparatus further comprises: a memory storing a packed data array, the packed data array comprising an entry for each data unit of the data units, the entry including specific packed field data for the data unit and either a compression profile corresponding to the compression profile information or an index that references the compression profile, wherein the data unpacker component is coupled to the memory.

In at least some of the above embodiments, at least a first data unit of the data units processed by the data unpacker is represented by first packed field data that has values for a different combination of fields than second packed field data that represents a second data unit of the data units; and/or for at least a first subset of the data units, the data unpacker component is configured to receive different particular compression profile information for different particular data units; and/or for at least a second subset of the data units, the data unpacker component is further configured to receive the same particular compression profile information.

In at least some of the above embodiments, the particular compression profile information indicates locations of the particular one or more fields in the particular packed field data; and the parsing logic is configured to extract the values from the particular packed field data based on the indicated locations and length information for each respective field of the particular one or more fields.

In at least some of the above embodiments, the particular compression profile information indicates locations of the particular one or more fields in the particular packed field data and packed length information for each respective field of the particular one or more fields; and the parsing logic is configured to extract the values from the particular packed field data based on the indicated locations and the packed length information.

In at least some of the above embodiments, the particular compression profile information specifies packed lengths for the particular one or more fields, the particular one or more fields including at least two fields for which the particular compression profile information specifies different packed lengths; and the parsing logic is configured to extract a value for a given field from the particular packed field data by extracting a number of bits equal to a given packed length, of the specified packed lengths, that was specified for the given field.

In at least some of the above embodiments, the data unpacker component is further configured to convert the extracted values into formats expected for data outputted by the outputs.

In at least some of the above embodiments, the data unpacker component is further configured to pad the extracted values to fixed lengths required for data outputted by the outputs.

In at least some of the above embodiments, the data unpacker component is further configured to pad at least a particular extracted value with a value specified by the particular compression profile.

In at least some of the above embodiments, based on data in the particular compression profile, the data unpacker component is further configured to shift a first subportion of a particular extracted value relative to a second subportion of the particular extracted values.

In at least some of the above embodiments, the data unpacker is further configured to extract values and pad the extracted values by performing one or more shift operations and one or more mask operations.

In at least some of the above embodiments, the particular compression profile information comprises an entry for each field in the master set of fields, the entry indicating at least whether the corresponding data unit has a value for the corresponding field, and the packed length of that value within the packed field data for the field.

In at least some of the above embodiments, the particular compression profile information corresponds to a selected compression profile, the apparatus further comprises a memory storing a plurality of compression profiles from which the selected compression profile is selected, and the selected compression profile indicates that any packed field data associated with the selected compression profile carries values for the particular one or more fields, wherein a second compression profile indicates that any packed field data associated with the second compression profile carries values for a second one or more fields that is different than the particular one or more fields.

In at least some of the above embodiments, the particular compression profile information corresponds to a selected compression profile, and the apparatus further comprises a memory storing a plurality of compression profiles from which the selected compression profile is selected, wherein the parsing logic is configured to extract a value for a given field based on a packed length specified by the particular compression profile information, the selected compression profile specifies a first packed length for a first field in the master set, and a second compression profile of the plurality of compression profiles specifies a second packed length for the first field.

In at least some of the above embodiments, the apparatus is a networking apparatus and the data unpacker component is implemented by a Field Programmable Gate Array or Application Specific Integrated Circuit within the networking apparatus.

In at least some of the above embodiments, each output of the outputs is configured to output a null or empty value when the compression profile indicates that the packed field data does not include a value for the field corresponding to the output. In at least some of the above embodiments, each output of the outputs is configured to output a validity bit, indicating whether or not the field mapped to the output is value-carrying for the currently processed data unit.

In at least some of the above embodiments, the input configured to receive particular packed field data and the input configured to receive compression profile information are a same input configured to receive a data structure comprising the compression profile information in a first set of bits and the particular packed field data in a second set of bits.

In at least some of the above embodiments, the apparatus further comprises: a fixed field filtering component comprising: an input configured to receive a packed representation of the particular data unit, the packed representation including at least the packed field data and a fixed number of bits corresponding to one or more fields of the particular data unit that have not been packed within the particular packed field data; filtering logic configured to extract the fixed number of bits from the packed representation; an output configured to output the fixed number of bits to another component; and a separate output configured to output at least the packed field data to the data unpacker component.

In at least some of the above embodiments, the data units are a first set of data units, the master set of fields is a first master set of fields, and the apparatus further comprises another data unpacker component configured to unpack a second set of data units, each data unit in the second set of data units having values for one or more fields in a second master set of fields that is different from the first master set of fields.

In at least some of the above embodiments, the parsing logic is configured to extract the values in multiple stages, each stage corresponding to a different subset of the master set of fields.

In at least some of the above embodiments, the apparatus further comprises: multiple data unpacker components, each configured to unpack a different portion of the particular data unit.

In at least some of the above embodiments, the data unpacker component is a first data unpacker component, and the apparatus further comprises a second data unpacker component configured to unpack a nested packed data unit that is outputted by one of the outputs of the first data unpacker component, the nested packed data unit associated with different compression profile information than the particular compression profile information.

In at least some of the above embodiments, the apparatus further comprises: a profiler component configured to identify and/or generate compression profiles, including a particular compression profile corresponding to the particular compression profile information, based on the data units; and a data packer component configured to generate and store the packed field data based on the compression profiles and the data units.

In at least some of the above embodiments, the particular compression profile information indicates that the particular value extracted for a given field maps to a specific subset of bits of the given field, and a given output outputs the particular value at the specific subset of bits. In an embodiment, the specific subset of bits does not include the lower and upper bits of the given field, and the packed data unit does not include data corresponding to the lower and upper bits of the given field.

According to some embodiments, a method comprises: for each particular data unit of a plurality of data units, each particular data unit having values for one or more fields in a master set of fields and being associated with a particular compression profile of a plurality of compression profiles: receiving particular packed field data for the particular data unit; receiving particular compression profile information corresponding to the particular compression profile associated with the particular data unit; based on the particular compression profile information associated with the particular data unit, identifying for which particular one or more fields, in the master set of fields, the particular packed field data stores values; extracting values from the particular packed field data for the particular one or more fields that have values in the packed field data; for each field of the particular one or more fields, outputting data based on a particular value extracted from the packed field data for the field.

In at least some of the above embodiments, the data output based on the particular value is the particular value, includes the particular value, represents the particular value, or is a function of the particular value.

In at least some of the above embodiments, the method comprises extracting multiple particular values for a particular field, and outputting field data that includes the multiple particular values at locations specified by the particular compression profile information.

In some of the embodiments, the method further comprises: receiving a particular compression profile index associated with the particular data unit; and based on the particular compression profile index, locating the particular compression profile in an array of the plurality of compression profiles.

In at least some of the above embodiments, at least a first data unit of the plurality of data units is represented by first packed field data that has values for a different combination of fields than second packed field data that represents a second data unit of the plurality of data units; and/or different particular compression profile information is associated with at least each first data unit in a first subset of the plurality of data units; and/or the same particular compression profile information is associated with at least each second data unit in a second subset of the plurality of data units.

In at least some of the above embodiments, the particular compression profile information indicates locations of the particular one or more fields in the particular packed field data and packed length information for each respective field of the particular one or more fields; wherein extracting the values from the particular packed field data is based on the indicated locations and the packed length information.

In at least some of the above embodiments, the method further comprises: padding the extracted values to fixed lengths expected for the corresponding fields for which the values were extracted.

In at least some of the above embodiments, padding the extracted values comprises inserting extra zeros into a particular field to reach a particular fixed length or inserting a fixed bit pattern into the particular field to reach the particular fixed length.

In at least some of the above embodiments, the particular compression profile indicates that any packed field data associated with the particular compression profile carries values for the particular one or more fields, wherein a second compression profile indicates that any packed field data associated with the second compression profile carries values for a second one or more fields that is different than the particular one or more fields.

In at least some of the above embodiments, extracting a value for a given field is based on a packed length specified by the particular compression profile information; and the particular compression profile specifies a first packed length for a first field in the master set, wherein a second compression profile of the plurality of compression profiles specifies a second packed length for the first field.

In at least some of the above embodiments, the method further comprises: receiving a packed representation of the particular data unit, the packed representation including at least the packed field data and a fixed number of bits corresponding to one or more fields of the particular data unit that have not been packed within the particular packed field data; and separating the fixed number of bits from the packed representation and outputting the fixed number of bits as one or more fixed fields prior to identifying the particular one or more fields from the particular compression profile information.

In at least some of the above embodiments, the method further comprises: identifying and/or generate compression profiles, including the particular compression profile, based on the plurality of data units; and generating and store packed field data for the plurality of data units based on the compression profiles and the data units.

In at least some of the above embodiments, the method is repeated with respect to a nested data unit packed inside of a first field of the particular data unit.

According to some embodiments, a method comprises identifying and/or generating compression profiles, based on the plurality of data units; and generating and storing packed field data for the plurality of data units based on the compression profiles and the data units.

Other examples of these and other embodiments are found throughout this disclosure.

6.0. IMPLEMENTATION MECHANISM—HARDWARE OVERVIEW

According to one embodiment, the techniques described herein are implemented by one or more special-purpose computing devices. The special-purpose computing devices may be desktop computer systems, portable computer systems, handheld devices, networking devices, or any other device that incorporates hard-wired and/or program logic to implement the techniques. The special-purpose computing devices may be hard-wired to perform the techniques, or may include digital electronic devices such as one or more application-specific integrated circuits (ASICs) or field programmable gate arrays (FPGAs) that are persistently programmed to perform the techniques. Such special-purpose computing devices may also combine custom hard-wired logic, ASICs, or FPGAs with custom programming to accomplish the techniques.

Though the foregoing techniques are described with respect to a hardware implementation, which provides a number of advantages in certain embodiments, it will also be recognized that, in another embodiment, the foregoing techniques may still provide certain advantages when performed partially or wholly in software. Accordingly, in such an embodiment, a suitable implementing apparatus comprises a general-purpose hardware processor and is configured to perform any of the foregoing methods by executing program instructions in firmware, memory, other storage, or a combination thereof.

Figure 13:
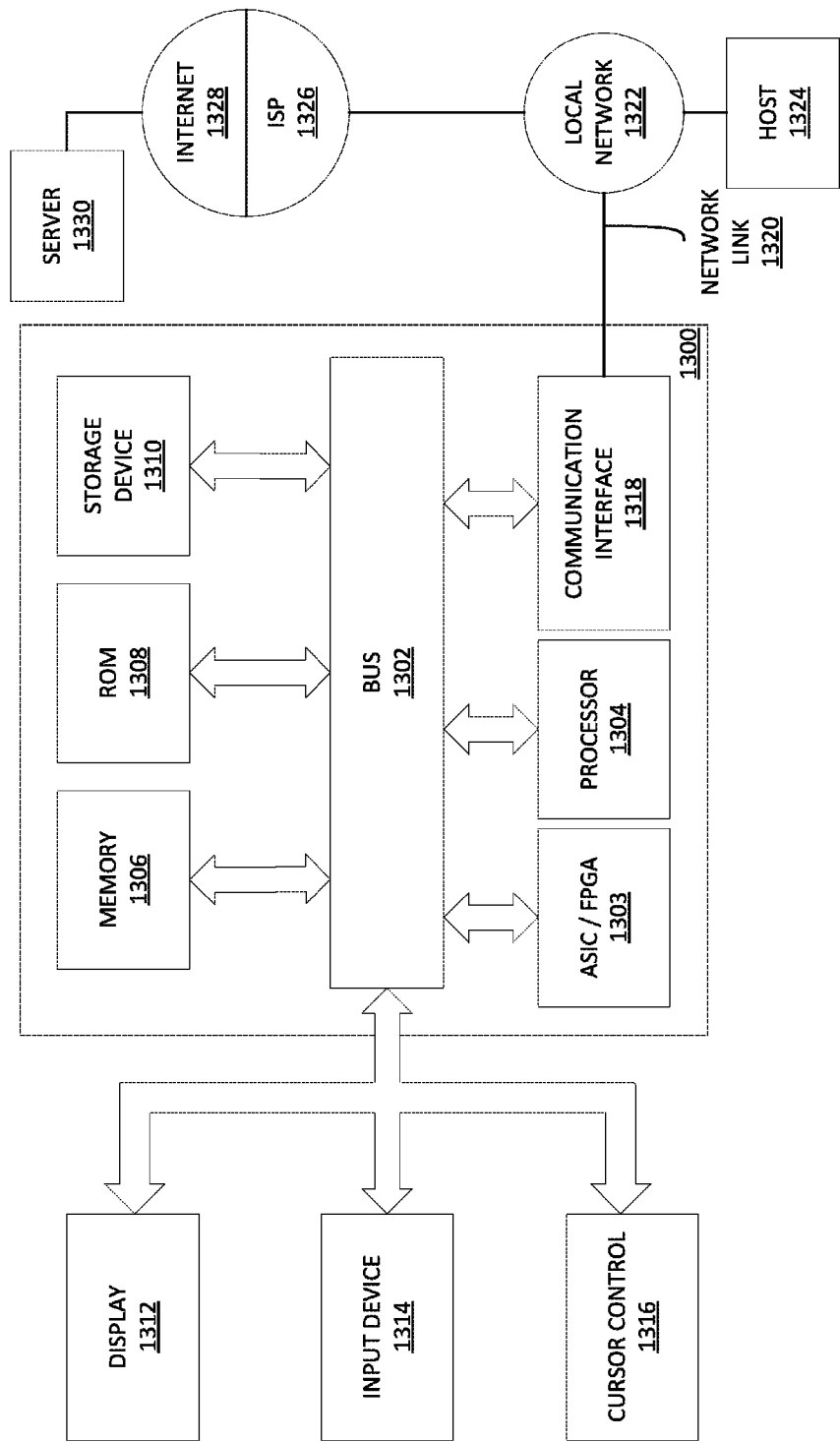
FIG. 13 is block diagram of a computer system upon which embodiments of the invention may be implemented.

FIG. 13 is a block diagram that illustrates a computer system 1300 that may be utilized in implementing the above-described techniques, according to an embodiment. Computer system 1300 may be, for example, a desktop computing device, laptop computing device, tablet, smartphone, server appliance, computing mainframe, multimedia device, handheld device, networking apparatus, or any other suitable device.

Computer system 1300 may include one or more ASICs, FPGAs, or other specialized circuitry 1303 for implementing program logic as described herein. Additionally, and/or instead, computer system 1300 may include one or more hardware processors 1304. Computer system 1300 may also include one or more busses 1302 or other communication mechanism for communicating information. Busses 1302 may include various internal and/or external components, including, without limitation, internal processor or memory busses, a Serial ATA bus, a PCI Express bus, a Universal Serial Bus, a HyperTransport bus, an Infiniband bus, and/or any other suitable wired or wireless communication channel.

Computer system 1300 also includes one or more memories 1306, such as a random access memory (RAM), registers, or other dynamic or volatile storage device for storing data units to be processed by the one or more ASICs, FPGAs, or other specialized circuitry 1303. Memory 1306 may also or instead be used for storing information and instructions to be executed by processor 1304. Memory 1306 may be directly connected or embedded within circuitry 1303 or a processor 1304. Or, memory 1306 may be coupled to and accessed via bus 1302. Memory 1306 also may be used for storing temporary variables, data units describing rules or policies, or other intermediate information during execution of program logic or instructions.

Computer system 1300 further includes one or more read only memories (ROM) 1308 or other static storage devices coupled to bus 1302 for storing static information and instructions for processor 1304. One or more storage devices 1310, such as a solid-state drive (SSD), magnetic disk, optical disk, or other suitable non-volatile storage device, may optionally be provided and coupled to bus 1302 for storing information and instructions.

A computer system 1300 may also include, in an embodiment, one or more communication interfaces 1318 coupled to bus 1302. A communication interface 1318 provides a data communication coupling, typically two-way, to a network link 1320 that is connected to a local network 1322. For example, a communication interface 1318 may be an integrated services digital network (ISDN) card, cable modem, satellite modem, or a modem to provide a data communication connection to a corresponding type of telephone line. As another example, the one or more communication interfaces 1318 may include a local area network (LAN) card to provide a data communication connection to a compatible LAN. As yet another example, the one or more communication interfaces 1318 may include a wireless network interface controller, such as a 802.11-based controller, Bluetooth controller, Long Term Evolution (LTE) modem, and/or other types of wireless interfaces. In any such implementation, communication interface 1318 sends and receives electrical, electromagnetic, or optical signals that carry digital data streams representing various types of information.

Network link 1320 typically provides data communication through one or more networks to other data devices. For example, network link 1320 may provide a connection through local network 1322 to a host computer 1324 or to data equipment operated by a Service Provider 1326. Service Provider 1326, which may for example be an Internet Service Provider (ISP), in turn provides data communication services through a wide area network, such as the world wide packet data communication network now commonly referred to as the "Internet" 1328. Local network 1322 and Internet 1328 both use electrical, electromagnetic or optical signals that carry digital data streams. The signals through the various networks and the signals on network link 1320 and through communication interface 1318, which carry the digital data to and from computer system 1300, are example forms of transmission media.

In an embodiment, computer system 1300 can send messages and receive data through the network(s), network link 1320, and communication interface 1318. In some embodiments, this data may be data units that the computer system 1300 has been asked to process and, if necessary, redirect to other computer systems via a suitable network link 1320. In other embodiments, this data may be instructions for implementing various processes related to the described techniques. For instance, in the Internet example, a server 1330 might transmit a requested code for an application program through Internet 1328, ISP 1326, local network 1322 and communication interface 1318. The received code may be executed by processor 1304 as it is received, and/or stored in storage device 1310, or other non-volatile storage for later execution. As another example, information received via a network link 1320 may be interpreted and/or processed by a software component of the computer system 1300, such as a web browser, application, or server, which in turn issues instructions based thereon to a processor 1304, possibly via an operating system and/or other intermediate layers of software components.

Computer system 1300 may optionally be coupled via bus 1302 to one or more displays 1312 for presenting information to a computer user. For instance, computer system 1300 may be connected via an High-Definition Multimedia Interface (HDMI) cable or other suitable cabling to a Liquid Crystal Display (LCD) monitor, and/or via a wireless connection such as peer-to-peer Wi-Fi Direct connection to a Light-Emitting Diode (LED) television. Other examples of suitable types of displays 1312 may include, without limitation, plasma display devices, projectors, cathode ray tube (CRT) monitors, electronic paper, virtual reality headsets, braille terminal, and/or any other suitable device for outputting information to a computer user. In an embodiment, any suitable type of output device, such as, for instance, an audio speaker or printer, may be utilized instead of a display 1312.

One or more input devices 1314 are optionally coupled to bus 1302 for communicating information and command selections to processor 1304. One example of an input device 1314 is a keyboard, including alphanumeric and other keys. Another type of user input device 1314 is cursor control 1316, such as a mouse, a trackball, or cursor direction keys for communicating direction information and command selections to processor 1304 and for controlling cursor movement on display 1312. This input device typically has two degrees of freedom in two axes, a first axis (e.g., x) and a second axis (e.g., y), that allows the device to specify positions in a plane. Yet other examples of suitable input devices 1314 include a touch-screen panel affixed to a display 1312, cameras, microphones, accelerometers, motion detectors, and/or other sensors. In an embodiment, a network-based input device 1314 may be utilized. In such an embodiment, user input and/or other information or commands may be relayed via routers and/or switches on a Local Area Network (LAN) or other suitable shared network, or via a peer-to-peer network, from the input device 1314 to a network link 1320 on the computer system 1300.

As discussed, computer system 1300 may implement techniques described herein using customized hard-wired logic, one or more ASICs or FPGAs 1303, firmware and/or program logic, which in combination with the computer system causes or programs computer system 1300 to be a special-purpose machine. According to one embodiment, however, the techniques herein are performed by computer system 1300 in response to processor 1304 executing one or more sequences of one or more instructions contained in main memory 1306. Such instructions may be read into main memory 1306 from another storage medium, such as storage device 1310. Execution of the sequences of instructions contained in main memory 1306 causes processor 1304 to perform the process steps described herein.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 1310. Volatile media includes dynamic memory, such as main memory 1306. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1302. Transmission media can also take the form of acoustic or light waves, such as those generated during radio-wave and infra-red data communications.

Various forms of media may be involved in carrying one or more sequences of one or more instructions to processor 1304 for execution. For example, the instructions may initially be carried on a magnetic disk or solid state drive of a remote computer. The remote computer can load the instructions into its dynamic memory and use a modem to send the instructions over a network, such as a cable network or cellular network, as modulated signals. A modem local to computer system 1300 can receive the data on the network and demodulate the signal to decode the transmitted instructions. Appropriate circuitry can then place the data on bus 1302. Bus 1302 carries the data to main memory 1306, from which processor 1304 retrieves and executes the instructions. The instructions received by main memory 1306 may optionally be stored on storage device 1310 either before or after execution by processor 1304.

7.0. EXTENSIONS AND ALTERNATIVES

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An apparatus comprising:
one or more data unpacker components, each data unpacker component configured to:
receive packed field data for data units;
receive compression profiles associated with the data units, each particular compression profile of the compression profiles identifying a particular set of fields and particular packed value lengths for at least some of the fields;
unpack the packed field data into values based on the compression profiles associated with the data units; and
output unpacked field data for the data units, the outputting comprising, for each particular data unit of the data units, outputting particular values unpacked for the particular set of fields identified by the particular compression profile associated with the particular data unit.

2. The apparatus of claim 1, wherein each data unpacker component is further configured to:
receive the packed field data in packed data units, wherein at least some of the packed data units include additional field data, each of the data units having a different packed data unit;
wherein the outputting of the unpacked field data further comprises, for each particular data unit whose packed data unit includes additional field data, outputting the additional field data.

3. The apparatus of claim 2, wherein the one or more data unpacker components include at least a first data unpacker and a second data unpacker, wherein at least the additional field data outputted by the first data unpacker is inputted as the packed field data that is received by the second data unpacker.

4. The apparatus of claim 3, wherein, for each particular data unit whose packed data unit includes additional field data, at least one of the particular values outputted by the first data unpacker is a compression profile for use by the second data unpacker.

5. The apparatus of claim 1, wherein the one or more data unpacker components include at least a first data unpacker and a second data unpacker that both unpack values for a same set of data units that have been packed into packed data units, the first data unpacker configured to unpack first values from first packed field data that corresponds to upper bits of the packed data units, the second data unpacker configured to unpack second values from second packed field data that corresponds to lower bits of the packed data units.

6. The apparatus of claim 1, further comprising one or more memories storing a queue of packed data units, a first data unpacker of the one or more data unpacker components receiving the packed field data by sequentially reading the packed data units from the queue, the queue further including, in association with each of the packed data units, either an associated compression profile or an identifier of the associated compression profile.

7. The apparatus of claim 1, wherein at least some of the data units are Internet Protocol packets.

8. The apparatus of claim 1, wherein each field in each particular set of fields is in a master set of fields for the corresponding data unpacker component, the data unpacker component comprising a different output for each field in the master set.

9. The apparatus of claim 1, further comprising one or more data packer components configured to generate the packed field data for the data units based on the compression profiles, and to store the packed field data in one or more memories with compression profile information indicating which compression profile is associated with which packed field data.

10. The apparatus of claim 1, wherein unpacking the packed field data comprises, for each particular data unit of the data units, extracting the particular values based on the particular packed value lengths and field location information indicated by the particular compression profile associated with the particular data unit.

11. The apparatus of claim 10, wherein the data unpacker component is further configured to convert the extracted particular values into formats expected for the particular set of fields.

12. The apparatus of claim 1, wherein the apparatus is a circuit configured to process network data.

13. One or more non-transitory computer-readable media storing instructions that, when executed by one or more computer devices, cause:
receiving packed field data for data units;
receiving compression profiles associated with the data units, each particular compression profile of the compression profiles identifying a particular set of fields and particular packed value lengths for at least some of the fields;
unpacking the packed field data into values based on the compression profiles associated with the data units; and
outputting unpacked field data for the data units, the outputting comprising, for each particular data unit of the data units, outputting particular values unpacked for the particular set of fields identified by the particular compression profile associated with the particular data unit.

14. The one or more non-transitory computer-readable media of claim 13, wherein the instructions, when executed by one or more computer devices, further cause:
receive the packed field data in packed data units, wherein at least some of the packed data units include additional field data, each of the data units having a different packed data unit;
wherein the outputting of the unpacked field data further comprises, for each particular data unit whose packed data unit includes additional field data, outputting the additional field data.

15. The one or more non-transitory computer-readable media of claim 14, wherein the instructions, when executed by one or more computer devices, further cause receiving the packed field data and outputting the unpacked field data using a first data unpacker component and a second data unpacker component, wherein at least the additional field data output by the first data unpacker component is inputted as the packed field data that is received by the second data unpacker component.

16. The one or more non-transitory computer-readable media of claim 15, wherein, for each particular data unit whose packed data unit includes additional field data, at least one of the particular values outputted by the first data unpacker component is a compression profile for use by the second data unpacker component.

17. The one or more non-transitory computer-readable media of claim 13, wherein the instructions, when executed by one or more computer devices, further cause receiving the packed field data by sequentially reading the packed data units from a queue of packed data units, the queue further including, in association with each of the packed data units, either an associated compression profile or an identifier of the associated compression profile.

18. The one or more non-transitory computer-readable media of claim 13, wherein at least some of the data units are Internet Protocol packets.

19. The one or more non-transitory computer-readable media of claim 13, wherein the instructions, when executed by one or more computer devices, further cause generating the packed field data for the data units based on the compression profiles, and storing the packed field data in one or more memories with compression profile information indicating which compression profile is associated with which packed field data.

20. The one or more non-transitory computer-readable media of claim 13, wherein unpacking the packed field data comprises, for each particular data unit of the data units, extracting the particular values based on the particular packed value lengths and field location information indicated by the particular compression profile associated with the particular data unit, and converting the extracted particular values into formats expected for the particular set of fields.

* * * * *